US011362232B2

(12) United States Patent
Chan

(10) Patent No.: US 11,362,232 B2
(45) Date of Patent: Jun. 14, 2022

(54) PHOTODIODES WITHOUT EXCESS NOISE

(71) Applicant: SRI International, Menlo Park, CA (US)

(72) Inventor: Winston K. Chan, Princeton, NJ (US)

(73) Assignee: SRI International, Menlo Park, CA (US)

(*) Notice: Subject to any disclaimer, the term of this patent is extended or adjusted under 35 U.S.C. 154(b) by 0 days.

(21) Appl. No.: 17/056,315

(22) PCT Filed: May 24, 2019

(86) PCT No.: PCT/US2019/033937
§ 371 (c)(1),
(2) Date: Nov. 17, 2020

(87) PCT Pub. No.: WO2020/031923
PCT Pub. Date: Jan. 16, 2020

(65) Prior Publication Data
US 2021/0249552 A1  Aug. 12, 2021

Related U.S. Application Data

(63) Continuation-in-part of application No. PCT/US2018/041574, filed on Jul. 11, 2018.

(51) Int. Cl.
H01L 31/107 (2006.01)
H01L 31/0304 (2006.01)
(Continued)

(52) U.S. Cl.
CPC ........... H01L 31/1075 (2013.01); G01J 1/44 (2013.01); G01S 7/4816 (2013.01); G01S 17/931 (2020.01);
(Continued)

(58) Field of Classification Search
CPC .......... H01L 31/1075; H01L 31/03046; H01L 31/035236; H01L 31/1844; G01S 7/4816; G01S 17/931
See application file for complete search history.

(56) References Cited

U.S. PATENT DOCUMENTS 5,075,750 A   12/1991  Kagawa
5,654,578 A    8/1997  Watanabe
(Continued)

OTHER PUBLICATIONS

International Search Report and Written Opinion, PCT/US2018/041574, ISA:US, dated Sep. 28, 2018, 14 pp.
(Continued)

Primary Examiner — Hoang-Quan Ho
(74) Attorney, Agent, or Firm — Rutan & Tucker, LLP

(57) ABSTRACT

A photodiode, such as a linear mode avalanche photodiode can be made free of excess noise via having a superlattice multiplication region that allows only one electrical current carrier type, such as an electron or a hole, to accumulate enough kinetic energy to impact ionize when biased, where the layers are lattice matched. A photodiode can be constructed with i) a lattice matched pair of a first semiconductor alloy and a second semiconductor alloy in a superlattice multiplication region, ii) an absorber region, and iii) a semiconductor substrate. A detector with multiple photodiodes can be made with these construction layers in order to have a cutoff wavelength varied anywhere from 1.7 to 4.9 µm as well as a noise resulting from a dark current at a level such that an electromagnetic radiation signal with the desired minimum wavelength cutoff can be accurately sensed by the photodiode.

20 Claims, 12 Drawing Sheets

(51) Int. Cl.
  *H01L 31/0352* (2006.01)
  *H01L 31/18* (2006.01)
  *G01J 1/44* (2006.01)
  *G01S 17/931* (2020.01)
  *G01S 7/481* (2006.01)

(52) U.S. Cl.
  CPC ............... *H01L 31/03046* (2013.01); *H01L 31/035236* (2013.01); *H01L 31/1844* (2013.01); *G01J 2001/4466* (2013.01)

(56) References Cited

U.S. PATENT DOCUMENTS

| | | |
|---|---|---|
| 8,772,729 B1 | 7/2014 | Brown et al. |
| 9,354,113 B1 | 5/2016 | Hayat et al. |
| 2003/0047752 A1 | 3/2003 | Campbell et al. |
| 2015/0276947 A1 | 10/2015 | Hoenk et al. |
| 2015/0287870 A1 | 10/2015 | Mohseni et al. |
| 2016/0005887 A1 | 1/2016 | Lo et al. |
| 2017/0012162 A1 | 1/2017 | Ghosh |

OTHER PUBLICATIONS

International Search Report and Written Opinion, PCT/US2019/033793, ISA:US, dated Aug. 8, 2019, 13 pp.

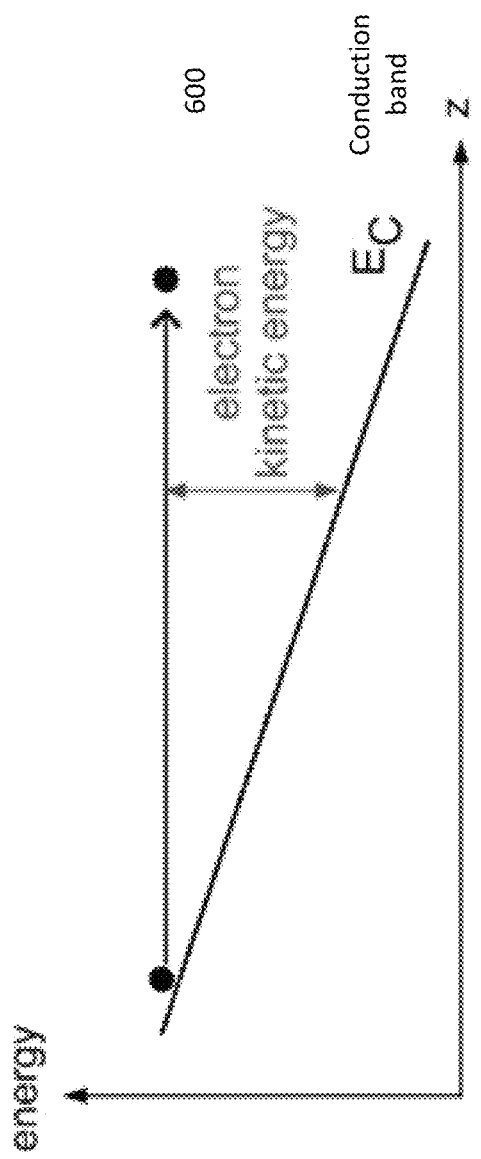
Figure 6a (a) bulk semiconductor: extended states
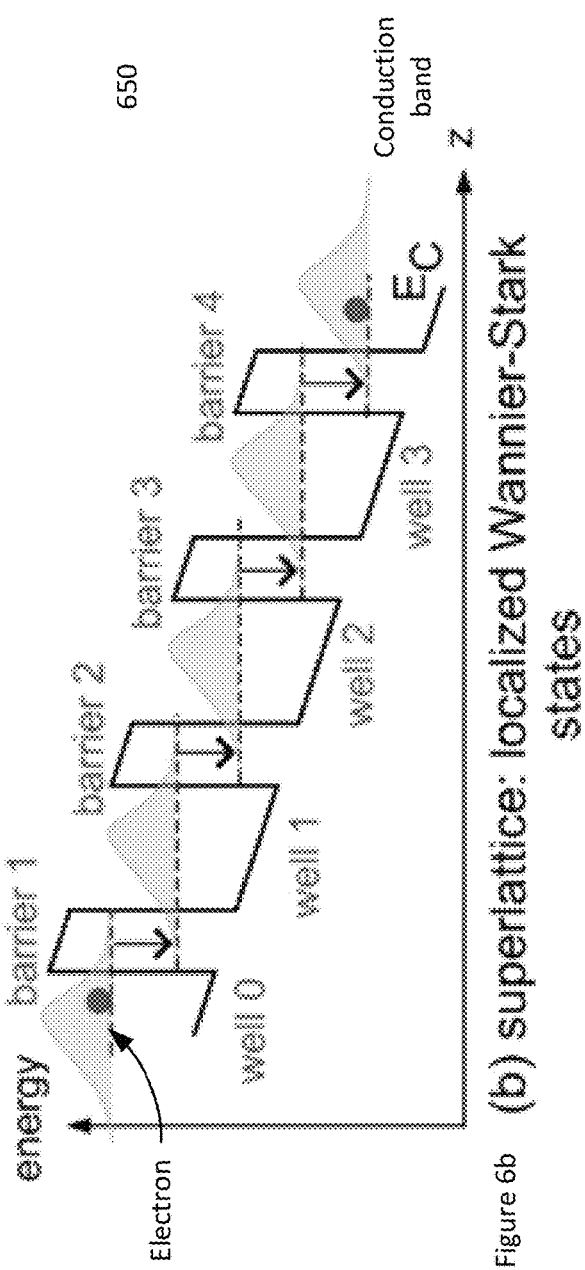
Figure 6b (b) superlattice: localized Wannier-Stark states

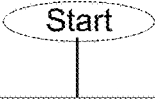

The photodiode can be created constructed with a lattice matched pair of a first semiconductor alloy and a second semiconductor alloy in a superlattice multiplication region, an absorber region, and a semiconductor substrate. 1102

The lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current. A third semiconductor alloy can forming an absorber region. The multiplication region and absorber region are lattice matched to the semiconductor substrate.
1104

The alloys in the multiplication region, the absorber region, and the semiconductor substrate are matched to provide the constructed photodiode to have a minimum wavelength cutoff between 1.0 um and 4.9 um as well as an operating temperature where a noise resulting from a dark current at a level such that an electromagnetic radiation signal with the desired minimum wavelength cutoff can be accurately sensed by the photodiode. The photodiode can be a linear mode avalanche photodiode with a wavelength cutoff of equal to or greater than 3.3 um.
1106

The photodiode including its i) substrate and ii) semiconductor layers can be manufactured via a complementary metal-oxide-semiconductor (CMOS) process using substantially a same manufacturing step to grow both an InGaAsSb layer of the multiplication region and an InGaAsSb layer of the absorber region.
1108

Fig. 11A  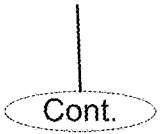

```
                    ( Cont. )
                        |
┌───────────────────────────────────────────────────────────────┐
│ The first semiconductor alloy in the multiplication region can be made up of │
│ InGaAsSb with the superlattice being set in a conduction band so that electrons │
│ impact ionize as well as the third semiconductor alloy in the absorber region can │
│ be made up of InGaAsSb, and the semiconductor substrate is made up of GaSb. │
│                                                          1110 │
└───────────────────────────────────────────────────────────────┘
                        |
┌───────────────────────────────────────────────────────────────┐
│ The first semiconductor alloy is paired with a second semiconductor alloy of │
│ AlGaAsSb to make up the multiplication region. The first semiconductor alloy and │
│ the second semiconductor alloy can form a lattice matched pair of semiconductor │
│ alloys making up the multiplication region of InGaAsSb and AlGaAsSb. │
│                                                          1112 │
└───────────────────────────────────────────────────────────────┘
                        |
┌───────────────────────────────────────────────────────────────┐
│ The lattice matched pair of semiconductor alloys making up the multiplication │
│ region can be In0.17Ga0.83As0.16Sb0.84 and Al0.26Ga0.74As0.02Sb0.98. The │
│ third semiconductor making up the absorber layer is InGaAsSb, and both regions │
│ are lattice matched to a GaSb substrate. │
│                                                          1114 │
└───────────────────────────────────────────────────────────────┘
                        |
┌───────────────────────────────────────────────────────────────┐
│ The semiconductor alloy making up the absorber region can be an InGaAs- │
│ GaAsSb superlattice that is lattice-matched to an InP substrate. The lattice │
│ matched pair of semiconductor alloys making up the multiplication region can be │
│ an InGaAsP-InAlAs superlattice. │
│                                                          1116 │
└───────────────────────────────────────────────────────────────┘
                        |
    Fig. 11B         ( End )
```

PHOTODIODES WITHOUT EXCESS NOISE

RELATED APPLICATION

This application is a 35 U.S.C. § 371 U.S. National Stage of International Patent Application No. PCT/US19/33937, titled "PHOTODIODES WITHOUT EXCESS NOISE" having an International Filing Date of May 24, 2019 which claims priority to and benefit of International PCT Patent Application No.: PCT/US18/41574, Filed: Jul. 11, 2018, Title: LINEAR MODE AVALANCHE PHOTODIODES WITHOUT EXCESS NOISE, as a continuation in part application and is hereby incorporated by reference in its entirety.

TECHNICAL FIELD

Embodiments of this disclosure relate generally to photodiodes.

BACKGROUND

The function of a photodetector is to sense incident light and to output an electrical current, the photocurrent, proportional to the incident light flux. Ideally, the photodetector produces one output electron or hole for every incident photon and every output electron or hole is the result of an incident photon. For many applications where the incident flux is low, the output current requires amplification before it can be used by subsequent electronics. In some previous photodetectors, in order to achieve photon counting, then a gain mechanism for multiplying the photocurrent by $10^4$ to $10^6$ is needed to detect a single photon. Besides increasing the amplitude of the current, amplifiers have the drawback of adding noise to the current.

Practically, the noise current from electronic amplifiers at room temperature for many types of photodetectors is well above that required for detecting a stream of single photons (photon counting). Since the amplifier noise is temperature-driven, for these type of photodetectors, then cooling the amplifier to cryogenic temperatures would lower its noise but this approach is acceptable only for a limited number of applications.

One current multiplication mechanism is impact ionization. Photodetectors based on this mechanism are known as avalanche photodiodes (APDs).

SUMMARY

Provided herein can be various methods, apparatuses, and systems for photodiodes.

In an embodiment, a photodiode, such as a linear mode avalanche photodiode can be made free of excess noise via having a superlattice multiplication region that allows only one electrical current carrier type, such as an electron or a hole, to accumulate enough kinetic energy to impact ionize when biased, where the layers are lattice matched. A photodiode can be constructed with i) a lattice matched pair of a first semiconductor alloy and a second semiconductor alloy in a superlattice multiplication region, ii) an absorber region, and iii) a semiconductor substrate. A detector with multiple photodiodes can be made with these construction layers in order to have a cutoff wavelength varied anywhere from 1.7 to 4.9 µm as well as a noise resulting from a dark current at a level such that an electromagnetic radiation signal with the desired minimum wavelength cutoff can be accurately sensed by the photodiode.

A photodiode can be constructed with i) a lattice matched pair of a first semiconductor alloy and a second semiconductor alloy in a superlattice multiplication region, ii) an absorber region, and iii) a semiconductor substrate. The absorber region can also have a superlattice construction of multiple semiconductor alloys. A given photodiode can be constructed with a lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current. The photodiode will have a third semiconductor alloy forming an absorber region and a semiconductor substrate. The multiplication region and absorber region can be lattice matched to the semiconductor substrate. The multiplication region and the absorber region alternatively stack upon each other starting from the semiconductor substrate.

The alloys in the multiplication region, the absorber region, and the semiconductor substrate are matched to provide the photodiode to have a minimum wavelength cutoff between 1.0 µm and 4.9 µm as well as a noise resulting from a dark current at a level such that an electromagnetic radiation signal with the desired minimum wavelength cutoff can be accurately sensed by the photodiode.

Many variations of this design will be discussed.

DRAWINGS

FIG. 6a illustrates an embodiment of a graph of an electron in bulk semiconductor with an applied electric field that is accelerated by the field and accumulates kinetic energy.

FIG. 6b illustrates an embodiment of a graph of the matched superlattice suppresses impact ionization by controlling the localized Wannier Stark states.

Figure 1:
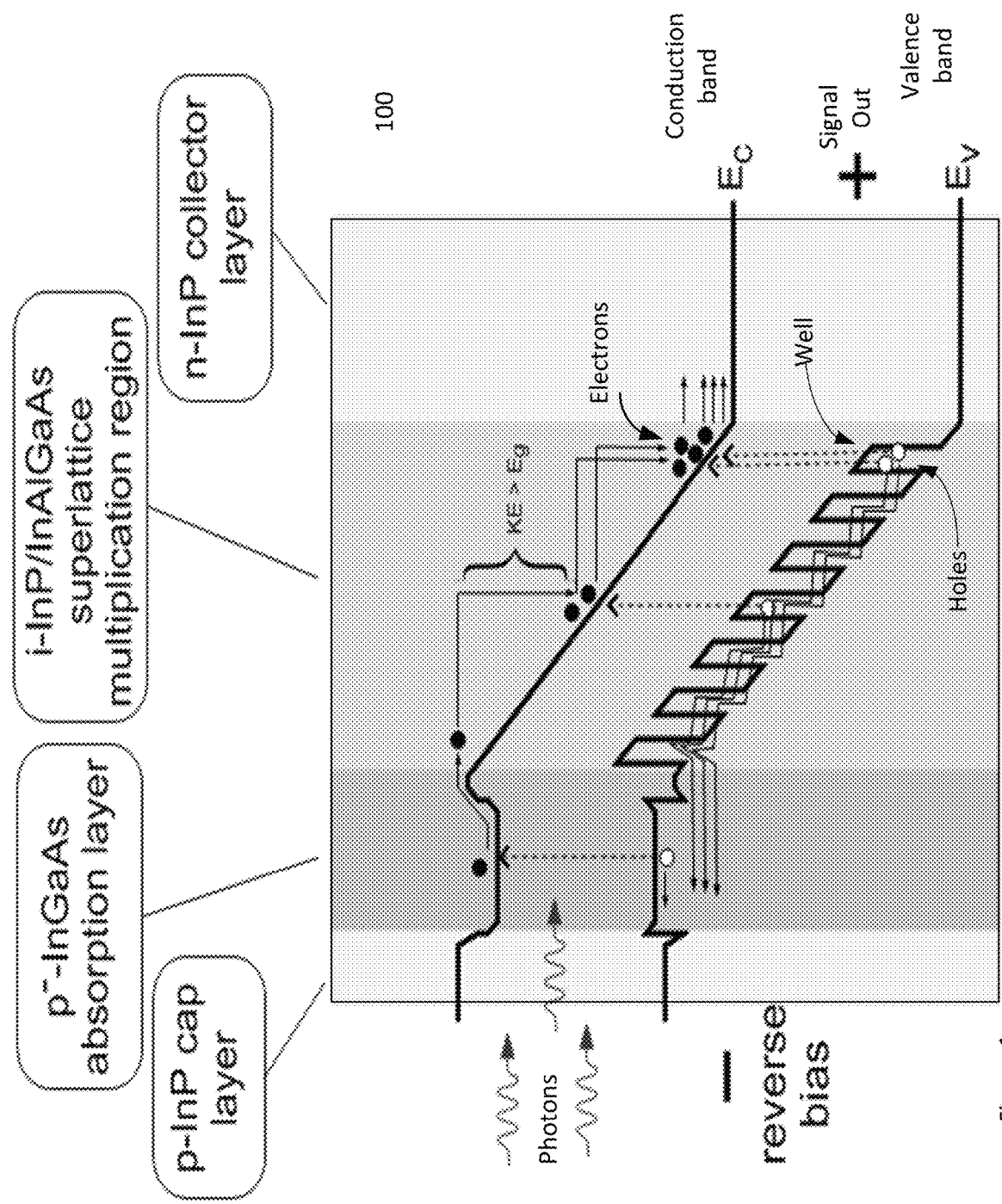
FIG. 1 illustrates an embodiment of a block diagram of a linear mode APD with a matched superlattice structure in which the excess noise is substantially eliminated via having a superlattice in the valence band when the carrier is a hole.

FIGS. 11A-11B illustrate a flow diagram of an embodiment of constructing a photodiode made free of excess noise via having a superlattice as well as lattice matching to have a minimum wavelength cutoff between 1.0 μm and 4.9 μm as well as a noise resulting from a dark current at a level such that an electromagnetic radiation signal with the desired minimum wavelength cutoff can be accurately sensed by the photodiode.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DETAILED DESCRIPTION

In the following description, numerous specific details can be set forth, such as examples of specific data signals, named components, number of frames, etc., in order to provide a thorough understanding of the present design. It will be apparent, however, to one of ordinary skill in the art that the present design can be practiced without these specific details. In other instances, well known components or methods have not been described in detail but rather in a block diagram in order to avoid unnecessarily obscuring the present design. Further, specific numeric references such as the first photodiode, can be made. However, the specific numeric reference should not be interpreted as a literal sequential order but rather interpreted that the first photodiode is different than a second photodiode. Thus, the specific details set forth can be merely exemplary. The specific details can be varied from and still be contemplated to be within the spirit and scope of the present design. The term "coupled" is defined as meaning connected either directly to the component or indirectly to the component through another component.

Figure 8:
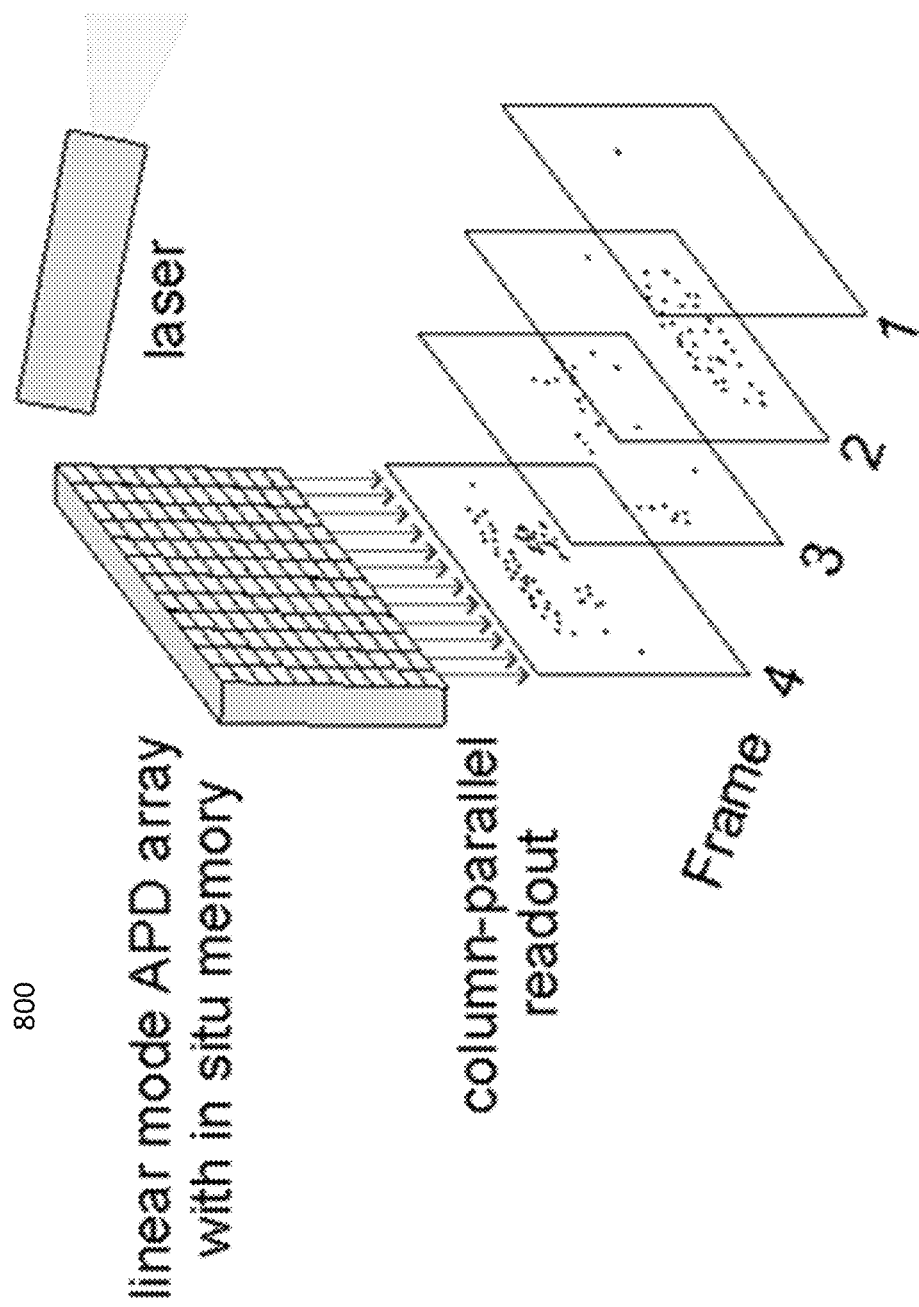
FIG. 8 illustrates an embodiment of a diagram of a linear mode APD array with a matched superlattice structure with in-situ memory and a parallel column readout.
Figure 9:
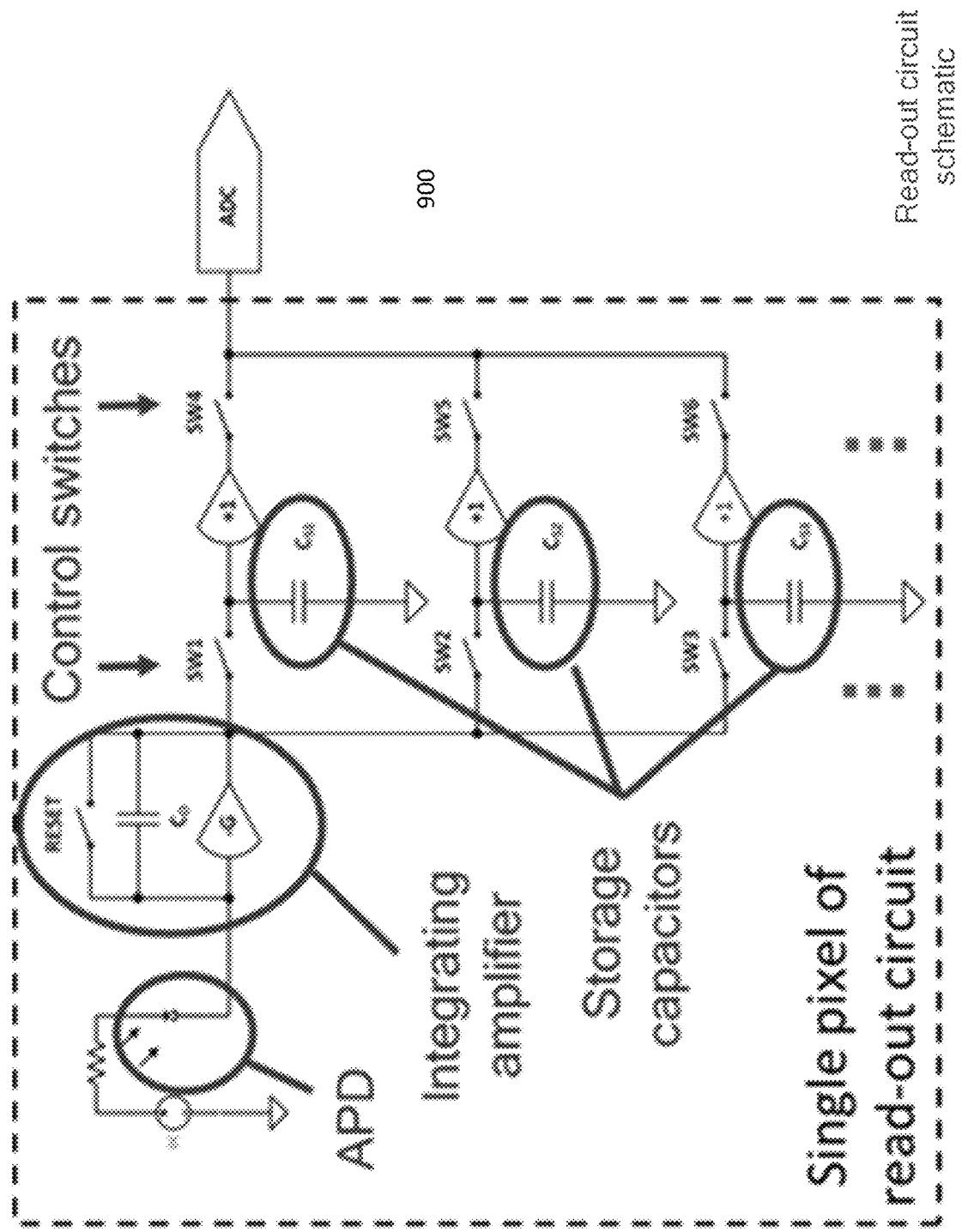
FIG. 9 illustrates an embodiment of a diagram of a Read-out circuit schematic with linear mode APDs with a matched superlattice structure.
Figure 10:
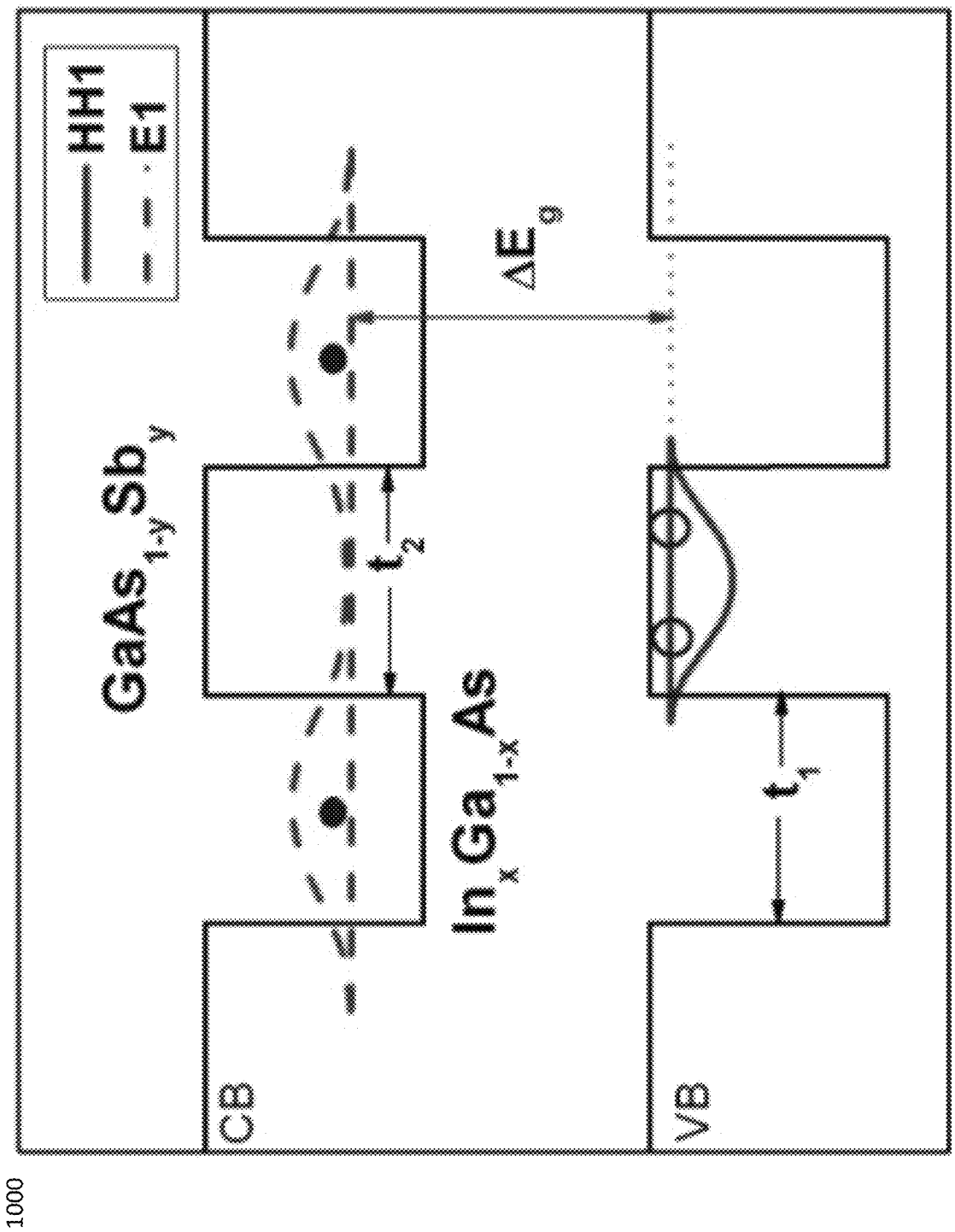
FIG. 10 illustrates a block diagram of an example InGaAs—GaAsSb superlattice band diagram.

FIGS. 1-9 discuss a first set of example photodiode constructions and techniques. FIGS. 10-11B discuss a second set of additional photodiode constructions and techniques. The second set of additional photodiode constructions and techniques builds upon and incorporates in concepts and techniques discussed in the first set.

In general methods, apparatuses, and systems are discussed. A photodiode, such as a linear mode avalanche photodiode can be made free of excess noise via having a superlattice multiplication region that allows only one electrical current carrier type, such as an electron or a hole, to accumulate enough kinetic energy to impact ionize when biased, where the layers are lattice matched. A photodiode can be constructed with i) a lattice matched pair of a first semiconductor alloy and a second semiconductor alloy in a superlattice multiplication region, ii) an absorber region, and iii) a semiconductor substrate. The absorber region can also have a superlattice construction of multiple semiconductor alloys. A given photodiode can be constructed with a lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current. The photodiode will have a third semiconductor alloy forming an absorber region and a semiconductor substrate. The multiplication region and absorber region can be lattice matched to the semiconductor substrate. The multiplication region and the absorber region alternatively stack upon each other starting from the semiconductor substrate. The alloys in the multiplication region, the absorber region, and the semiconductor substrate are matched to provide the photodiode to have a minimum wavelength cutoff between 1.0 μm and 4.9 μm as well as a noise resulting from a dark current at a level such that an electromagnetic radiation signal with the desired minimum wavelength cutoff can be accurately sensed by the photodiode.

A second set of example photodiode constructions and techniques building upon and incorporating in concepts and techniques discussed in the first set are discussed below.

FIG. 10 illustrates a block diagram of an example InGaAs—GaAsSb superlattice band diagram. The photodiode's layer 1000 can be constructed such that electrons are largely confined in the InGaAs—GaAsSb layers and holes in the GaAsSb layers. The diagram outlines the GaAs1-ySby alloy interacting with the InxGa1-xAs alloy such that only one electrical current carrier type, such as an electron or a hole, will accumulate enough kinetic energy to impact ionize when biased.

A photodiode, such as a linear mode avalanche photodiode (LM-APD), can be made free of excess noise via having a superlattice gain region that allows only one electrical current carrier type, such as an electron or a hole, to accumulate enough kinetic energy to impact ionize when biased, where the layer the different regions are lattice matched.

A photodiode can be constructed with i) a lattice matched pair of a first semiconductor alloy and a second semiconductor alloy in a superlattice multiplication region, ii) an absorber region, and iii) a semiconductor substrate.

A photodiode using these lattice matching techniques herein can be used to create a short-wave infrared (SWIR) linear mode avalanche photodiode (LM-APD) that has a >2.0-μm cutoff wavelength and a >250 K operating temperature.

Multiple example photodiode constructions herein can extend a linear mode avalanche photodiode (LM-APD) beyond 2-μm wavelength with an operating temperature >250 K.

A. In a first example photodiode, a first semiconductor alloy and a second semiconductor alloy can form a lattice matched pair of semiconductor alloys making up the multiplication region. This particular multiplication region can consist of Indium Gallium Arsenic Antimonide (InGaAsSb) and Aluminum-Gallium Arsenic Antimonide (AlGaAsSb). A third semiconductor alloy making up the absorber region is InGaAsSb. The semiconductor substrate is made up of Gallium Antimonide (GaSb). Both regions are lattice matched to the GaSb substrate.

The multiplication region can be made up of an alloy with a composition of i) a first semiconductor alloy of $In_{0.09}Ga_{0.91}As_{0.08}Sb_{0.92}$ and ii) the second semiconductor alloy for the multiplication region is made up of an alloy with a composition of $Al_{0.14}Ga_{0.86}As_{0.01}Sb_{0.99}$. In another example, the lattice matched pair of semiconductor alloys making up the multiplication region can have a different make up of, for example, $In_{0.17}Ga_{0.83}As_{0.16}Sb_{0.84}$ and $Al_{0.26}Ga_{0.74}As_{0.02}Sb_{0.98}$. Also, the construction of the photodiode can have an InGaAsSb absorber region that is lattice-matched to GaSb.

The superlattice of the multiplication region is lattice-matched to the GaSb substrate. Note, an InGaAsSb—AlGaAsSb superlattice of the multiplication region is of particular interest because its larger band offset can lead to higher gain free of excess noise.

A detector with multiple photodiodes can be made with these construction layers in order to have a cutoff wavelength varied anywhere from 1.7 to 4.9 μm.

B. The lattice matched pair of semiconductor alloys making up the multiplication region can also include a superlattice with the first and second semiconductor alloys of Indium Gallium Arsenic Phosphide (InGaAsP) and Indium Aluminum Arsenide (InAlAs). A third semiconductor alloy making up the absorber region can be an Indium Gallium Arsenide (InGaAs) and Gallium Arsenic Antimonide (GaAsSb) superlattice that is lattice-matched to an Indium Phosphide (InP) substrate.

The construction of this photodiode can replace the InGaAs absorber region of other example constructions with the InGaAs—GaAsSb Type-II superlattice absorber region that is lattice-matched to the InP substrate. Detectors made with this absorber region can have at least a 2.4-μm wavelength cutoff wavelength. The InGaAsP—InAlAs superlattice multiplication region will be matched to the absorber region.

In general, a photodiode can be created constructed with i) a lattice matched pair of a first semiconductor alloy and ii) a second semiconductor alloy in a superlattice multiplication region, an absorber region, and iii) a semiconductor substrate.

The lattice matched pair of a first semiconductor alloy and a second semiconductor alloy in the superlattice multiplication region are matched to allow only one electrical-current carrier type selected from i) an electron or ii) a hole to accumulate enough kinetic energy to impact ionize when the photodiode is electrically biased to conduct electrical current. A third semiconductor alloy can form the absorber region. The multiplication region and absorber region are also lattice matched to the semiconductor substrate. The multiplication region and the absorber region can alternatively stack upon each other starting from the semiconductor substrate.

The alloys in the multiplication region, the absorber region, and the semiconductor substrate are lattice matched to provide the constructed photodiode to have a minimum wavelength cutoff between 1.0 μm and 4.9 μm as well as a noise resulting from a dark current at a level (e.g. is matched to minimize an amount of dark current) such that an electromagnetic radiation signal with the desired minimum wavelength cutoff can be accurately sensed by the photodiode. The matching is set for a noise resulting from a dark current to be minimized such that an electromagnetic radiation signal is properly sensed by the photodiode.

Note, dark current can be the relatively small electric current that flows through photosensitive devices such as a photodiode even when no photons are entering the photosensitive device. In an embodiment, the alloys in the multiplication region, the absorber region, and the semiconductor substrate are lattice matched to provide the constructed photodiode to have a minimum wavelength cutoff equal to or below 4.9 μm. In an embodiment, the alloys in the multiplication region, the absorber region, and the semiconductor substrate are lattice matched to provide the constructed photodiode to have a minimum wavelength cutoff of at least 3.3 μm.

The photodiode including its i) substrate and ii) semiconductor layers can be manufactured via a complementary metal-oxide-semiconductor (CMOS) process. The photodiode can be manufactured via the CMOS compatible process uses substantially a same manufacturing step to grow both an Indium Gallium Arsenic Antimonide (InGaAsSb) layer of the multiplication region and an InGaAsSb layer of the absorber region. The superlattice matching with these semiconductors can get the absorption at the higher maximum cutoff wavelengths, such as 1.7 μm, 3.3 μm and beyond.

In an embodiment, the photodiode may be constructed with i) a multiplication region with a composition of $In_{0.09}Ga_{0.91}As_{0.08}Sb_{0.92}$ with the superlattice being set in the conduction band, and ii) an InGaAsSb absorber region, with alternating stacking layers of multiplication region and absorber region. The alternating stacking layers of multiplication region and absorber region are grown on a Gallium Antimonide (GaSb) substrate.

Different sets of semiconductors that can be grown on the Gallium Antimonide substrate are constructed to give the photodiode the ability to have maximum cutoff wavelengths, such as 1.7 μm, 3.3 μm and beyond. The Gallium Antimonide substrate can have semiconductors grown on that substrate, which has absorption of electrical current carriers at the higher wavelengths.

One or more of the semiconductors regions have a superlattice. In an example, two semiconductors in the superlattice structure of the multiplication region consists of a first semiconductor alloy of Aluminum-Gallium Arsenic Antimonide $(Al_{0.14}Ga_{0.86}As_{0.01}Sb_{0.99})$ and a second semiconductor alloy of Indium Gallium Arsenic Antimonide $(In_{0.09}Ga_{0.91}As_{0.08}Sb_{0.92})$ with the superlattice being set in the conduction band. The electrons can be a first electrical current carrier set for multiplication. The superlattice structure can be used as a multiplication region in this example and as an absorber region in other example photodiodes.

Note, a composition of the absorber region can be made of a similar alloy, but not exact.

In an example, the absorber region can have a similar alloy of Indium Gallium layer of the absorber region to be same or similar to the multiplication region. In addition, the other alloy portion of the multiplication region is a paired semiconductor to match this change. Note, a reason for a change to an Indium component in the alloys is because it is easier to grow the same layer for both the multiplication and absorption region.

An example constructed photodiode can have an InGaAs absorber region with a cutoff wavelength of at least 1.6 μm, and an InGaAsP—InAlAs superlattice multiplication region, all lattice matched to an InP substrate.

The above embodiments of the photodiode can potentially achieve a pixel pitch down to 15-μm for high-resolution imaging applications.

Additional Details on Adapting an Example Linear Mode APD to the SWIR Band

Various approaches can be used for a low-excess-noise LM-APD design so that it has a strong photoresponse to wavelengths of greater than 2.0 μm. Two example approaches—i) an InGaAs—GaAsSb Type-II superlattice absorber on InP and ii) an InGaAsSb absorber on GaSb—will be discussed in more detail below. Both photodiode constructions can satisfy the operating temperature constraint of beyond 2-μm wavelength with an operating temperature >250 K. A third photodiode approach, InGaAs absorber on InP, will also further be discussed below, that can be used for imagers sensitive to wavelengths between 1.6 and 2.5 µm.

Photodiodes including APDs using an InGaAs—GaAsSb Type II Superlattice absorber region on InP can absorb, electrons and/or holes, in the SWIR band. Since the InGaAs—GaAsSb Type II Superlattice absorber region is comprised of layers that are each lattice-matched to InP, it does not have any of the mismatch issues of extended InGaAs.

The InGaAs—GaAsSb Type II superlattice constructed on an InP substrate could have an achievable cutoff wavelength of 2.4 µm in the short term and 4.2 µm in the long term. Note, in this case the quantum efficiency (QE) decreases as cutoff increases.

A photodiode using InGaAsSb on a GaSb substrate with a Type I superlattice could have an achievable cutoff wavelength of 2.3 µm in the short term and 4.9 µm in the long term. The multiplication region superlattice has a larger band offset for higher gain.

Matching

In an example, the effective bandgap of the InGaAs—GaAsSb superlattice is tuned by changing the thickness of the two constituent layers. Increasing the thickness of the InGaAs layer lowers the electron miniband, while increasing the thickness of the GaAsSb layer raises the light and heavy hole minibands. Either of these changes will decrease the effective bandgap. Because the electrons are concentrated in the InGaAs wells and the holes in the GaAsSb inverted wells, the overlap between the electron and hole wavefunctions decreases as the wavefunctions become more localized within the well as the layers become thicker. The localization has two effects that decrease the QE. First, the transition probability, which depends on the wavefunction overlap, is lower and results in a lower absorption coefficient. Second, the carrier transport is slower because it is more difficult for carriers to tunnel from well to well—thus, many of the photogenerated electron-hole pairs will recombine before they can leave the absorption region. A superlattice with 5 nm for each layer gives a reasonable compromise for this tradeoff and has resulted in photodiodes with a cutoff wavelength of 2.39 µm and a QE of 43% at 2.23 µm. Strain-compensated InGaAs—GaAsSb superlattices can be used as a way around this tradeoff, but with little success in obtaining high QE at long wavelengths.

The dark current of a lattice-matched InGaAs—GaAsSb superlattice photodiode is matched to be set at a low bias. This is where the recombination-generation current dominates, and is similar to that of an extended InGaAs photodiode with similar bandgap and at similar temperature. Although a lattice-matched InGaAs—GaAsSb superlattice photodiode does not have the threading dislocations of an extended InGaAs photodiode, it has high dark current that may be due to unintentional intermixing at the interfaces to form, for example, InSb precipitates. Note, unintentional AlP formation in the multiplication superlattice could be solved by optimizing the growth conditions, including the timing in which precursor gases are introduced into the growth chamber.

In an example, an InGaAs—GaAsSb superlattice absorber region can be used for a SWIR LM-APD. The InGaAs—GaAsSb superlattice absorber region could use the design for the 2.4-µm cutoff and 43% QE, along with the absorber region superlattice optimized with growth conditions for a low dark current.

InGaAsSb Absorber Region on a GaSb Substrate

The InGaAsSb absorber region approach employs a spatially direct bandgap semiconductor (for a high absorption coefficient and a high QE) that is lattice-matched to the GaSb substrate (for low defect density).

Lattice-matching to the GaSb substrate instead of InP also will use a new multiplication superlattice. A multiplication superlattice comprised of $In_{0.17}Ga_{0.83}As_{0.16}Sb_{0.84}$ and $Al_{0.26}Ga_{0.74}As_{0.02}Sb_{0.98}$ has only a conduction band offset. The multiplication superlattice offset is 0.502 eV, compared to a 0.399 eV for an example InGaAsP—InAlAs superlattice. With the better confinement of the electrons in the deeper wells, higher gains can be attainable because higher fields can be applied to the superlattice before the electrons can escape the wells.

A concern with the InGaAsSb absorber region is that for some alloy concentrations the alloy phase-separates. This alloy phase-separation is referred to as the miscibility gap and occurs for alloys with bandgap wavelengths between about 2.3+µm and 4.4 µm. An InGaAsSb absorber region can use the 2.3-µm alloy, which avoids the phase separation. To obtain absorbers with direct transitions (in k-space and in real space) at longer cutoff wavelengths, the photodiode construction can use several strategies depending on the wavelength:

a. the design can change the growth temperature and the growth rate to obtain cutoff wavelengths slightly longer than 2.3 µm.
b. the design can grow lattice-matched alloys at the long wavelength end of the miscibility gap to obtain cutoff wavelengths between 4.4 µm and 4.9 µm.
c. To obtain cutoffs between 2.3 µm and 4.9 µm, the design can use an absorption layer that consists of a (Type I) superlattice of the alloys on either end of the miscibility gap. The absorption superlattice will consist of two alloys that are stable by design, and it will have an effective bandgap determined by the relative thickness of the two alloys that mimics any alloy in the miscibility gap.

To summarize, the InGaAsSb alloy will have the strong absorption characteristic of a direct gap semiconductor and can be grown lattice-matched to almost a 5-µm cutoff. The multiplication superlattice is lattice-matched to the GaSb. Note, this superlattice has the potential to give higher gain because of its larger band offset.

As discussed, multiple example approaches can be used to extend a LM-APD beyond the 2.0-µm wavelength at operating temperatures above 250 K. A first example photodiode discussed above has a 2.4-µm wavelength cutoff requiring only a few design changes from other LM-APD structures discussed herein. It has limited options for achieving longer cutoffs, and it has dark current that so far is at a high level for a lattice-matched absorber region. A first example photodiode discussed above has a 2.3-µm wavelength cutoff using a new multiplication region superlattice that potentially gives higher excess-noise-free gain. The cutoff wavelength for the second example photodiode approach can be extended to longer wavelengths (4.9 µm) without sacrificing QE.

Note, a pixel pitch down to 15 µm can also be achieved for our LM-APD. The lower sensitivity of a LM-APD to bias and temperature (compared to a Geiger mode APD) is also important in achieving high yield in large arrays.

Growth Methods

The photodiode can be grown to avoid a high density of threading dislocations and therefore very high dark current. These growth methods all require a series of buffer layers that gradually change the substrate lattice parameter from that of, for example, InP to that of the extended InGaAs alloy; this prevents most threading dislocations from entering the extended InGaAs layer. The thicknesses of these buffer layers can sum to 5-10 µm. When grown correctly, the buffer layers greatly reduce the density of dislocations threading through the extended InGaAs but do not completely eliminate them.

Before mating the extended wavelength InGaAs to the superlattice gain region, the design needs to consider whether the superlattice will be above or below the absorber region. If the InGaAs is above, the threading dislocations in the extended InGaAs will also thread through the superlattice, where they would likely be nucleation centers for premature breakdown. If the superlattice is below, photo-generated carriers will have to traverse the thick buffer layers, where many of the dislocations arising from the lattice mismatch are concentrated. Depending on the details, (1) these dislocations can be generation centers that give rise to large dark currents, (2) they can capture and annihilate photogenerated electrons and holes and prevent their detection, or (3) they can capture one type of photogenerated carrier and re-emit them at a later time to give slow response times and memory effects.

FIGS. 11A-11B illustrate a flow diagram of an embodiment of constructing a photodiode made free of excess noise via having a superlattice as well as lattice matching to have a minimum wavelength cutoff between 1.0 µm and 4.9 µm as well as a noise resulting from a dark current at a level such that an electromagnetic radiation signal with the desired minimum wavelength cutoff can be accurately sensed by the photodiode. A method 1100 of constructing a photodiode can be carried out. The example steps of the can be taken out of order and not necessarily use all of the steps or be limited to just these steps.

In step 1102, a photodiode can be created constructed with a lattice matched pair of a first semiconductor alloy and a second semiconductor alloy in a superlattice multiplication region, an absorber region, and a semiconductor substrate.

In step 1104, the lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current. A third semiconductor alloy can form an absorber region. The multiplication region and absorber region are lattice matched to the semiconductor substrate, where the multiplication region and the absorber region alternatively stack upon each other starting from the semiconductor substrate.

In step 1106, the alloys in the multiplication region, the absorber region, and the semiconductor substrate are matched to provide the constructed photodiode to have a minimum wavelength cutoff between 1.0 µm and 4.9 µm as well as an operating temperature where a noise resulting from a dark current at a level (is matched to minimize an amount of dark current) such that an electromagnetic radiation signal with the desired minimum wavelength cutoff can be accurately sensed by the photodiode. The photodiode can be a linear mode avalanche photodiode with a wavelength cutoff of equal to or greater than 3.3 µm. These alloy configurations can have an operating range that will be responsive in all lower wavelengths.

In step 1108, the photodiode including its i) substrate and ii) semiconductor layers can be manufactured via a complementary metal-oxide-semiconductor (CMOS) process using substantially a same manufacturing step to grow both an InGaAsSb layer of the multiplication region and an InGaAsSb layer of the absorber region.

In step 1110, the first semiconductor alloy in the multiplication region can be made up of InGaAsSb with the superlattice being set in a conduction band so that electrons impact ionize as well as the third semiconductor alloy in the absorber region can be made up of InGaAsSb, and the semiconductor substrate is made up of GaSb. Note, the first semiconductor alloy making up the multiplication region can be made up of an alloy with a composition of $In_{0.09}Ga_{0.91}As_{0.08}Sb_{0.92}$, and the third semiconductor alloy making up the absorber region is a similar alloy of InGaAsSb but does not have a same composition as the multiplication region.

In step 1112, as discussed, the first semiconductor alloy is paired with a second semiconductor alloy of AlGaAsSb to make up the multiplication region. The first semiconductor alloy and the second semiconductor alloy can form a lattice matched pair of semiconductor alloys making up the multiplication region of InGaAsSb and AlGaAsSb. The second semiconductor alloy for the multiplication region can be made up of an alloy with a composition of $Al_{0.14}Ga_{0.86}As_{0.01}Sb_{0.99}$.

In step 1114, the lattice matched pair of semiconductor alloys making up the multiplication region can be $In_{0.17}Ga_{0.83}As_{0.16}Sb_{0.84}$ and $Al_{0.26}Ga_{0.74}As_{0.02}Sb_{0.98}$. The third semiconductor making up the absorber layer is InGaAsSb, and both regions are lattice matched to a GaSb substrate. This construction can achieve an example cutoff wavelength of 2.3 µm.

In step 1116, the semiconductor alloy making up the absorber region can be an InGaAs—GaAsSb superlattice that is lattice-matched to an InP substrate. The lattice matched pair of semiconductor alloys making up the multiplication region can be an InGaAsP—InAlAs superlattice.

A first set of example photodiode constructions and techniques are discussed below.

An array of a plurality of linear mode avalanche photodiodes with a matched superlattice structure may be used in a system. Each linear mode avalanche photodiode senses light and outputs electrical current by being configured to, generate a gain equal to or greater than 1000 times amplification while generating an excess noise factor of less than 3 times a thermal noise present at or above a non-cryogenic temperature due to the gain from the amplification. The linear mode avalanche photodiode detects one or more photons in the light by using a superlattice structure that is matched to suppress impact ionization for a first carrier in the linear mode avalanche photodiode while at least one of 1) increasing impact ionization, 2) substantially maintaining impact ionization, and 3) suppressing impact ionization to a lesser degree for a second carrier. The first carrier having its impact ionization suppressed is either i) an electron or ii) a hole; and then, the second carrier is respectively the electron or the hole. The power supply is used to power the plurality of linear mode avalanche photodiodes.

Figure 5:
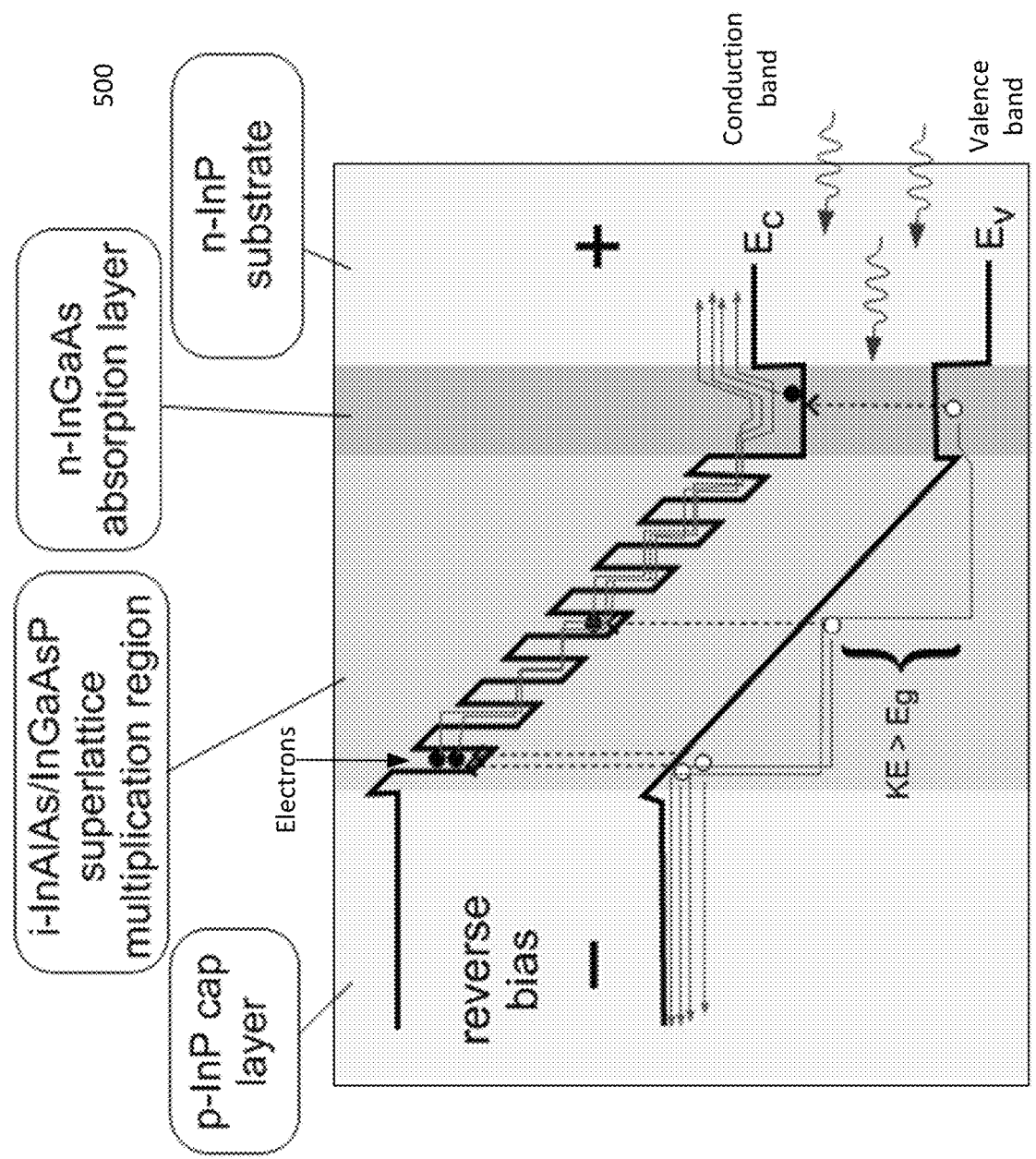
FIG. 5 illustrates an embodiment of a block diagram of a linear mode APD with a matched superlattice structure in which the excess noise is substantially eliminated via having a superlattice in the conduction band when the carrier is an electron.
Figure 7:
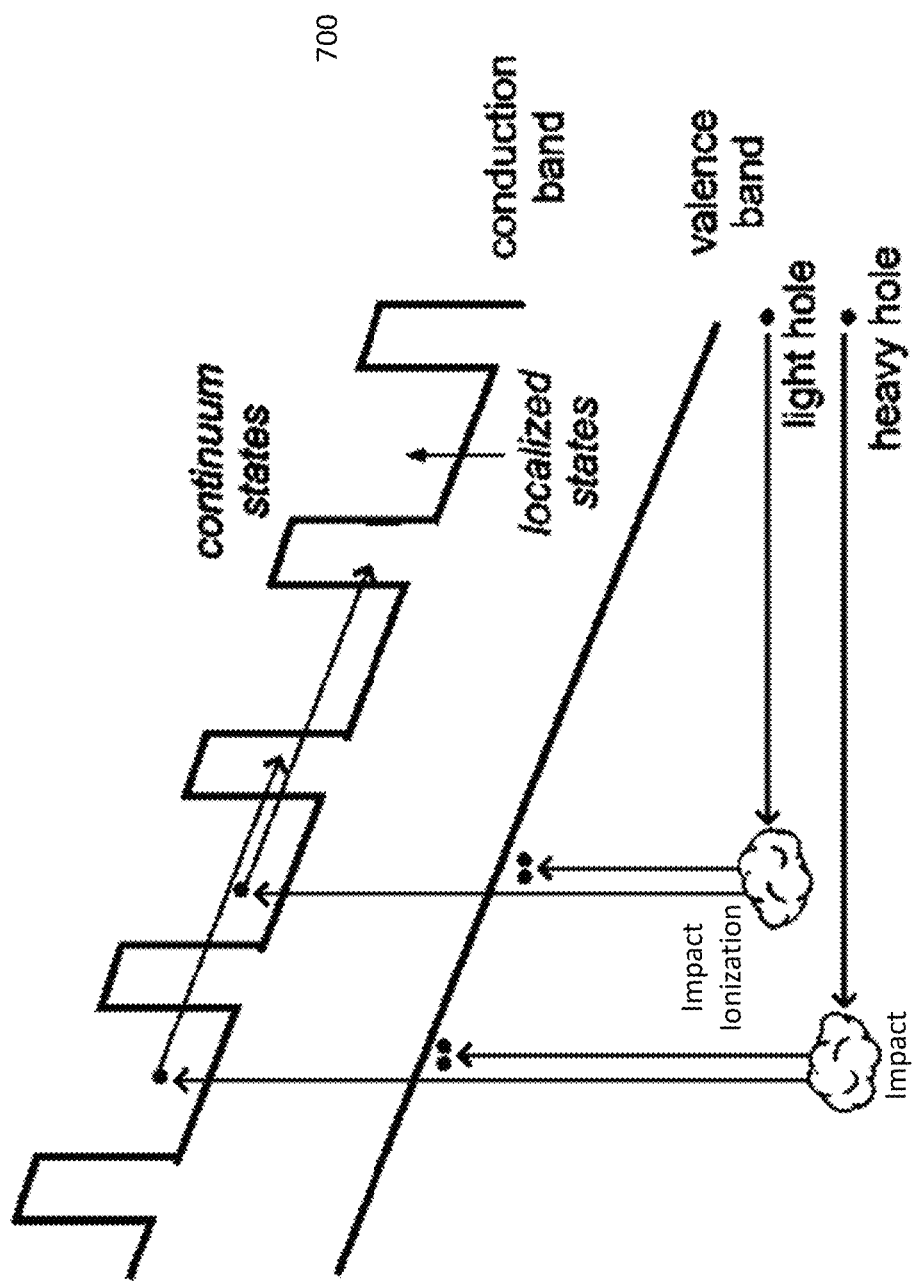
FIG. 7 illustrates an embodiment of a graph of a linear mode APD with a matched superlattice design where electron multiplication, but not the hole multiplication, is suppressed.

FIGS. 1 and 5 illustrate a linear mode APD 100, 500 with a cap layer, an absorption layer, a matched superlattice structure in the superlattice multiplication region, and a collector layer. A voltage controller applies a reverse bias to the linear mode APD 100, 500. The linear mode APD 100, 500 senses light and outputs electrical current by being configured to, generate a potentially exponential gain equal to or greater than 1000 times amplification while generating an excess noise factor of less than 3 times a thermal noise present at or above a non-cryogenic temperature due to the gain from the amplification. The superlattice structure is matched to suppress impact ionization for first carrier in the linear mode APD 100, 500 while maintaining impact ionization for the other carrier. The first carrier having its impact ionization suppressed is either i) an electron or ii) a hole; and then, the other carrier maintaining its impact ionization is the electron or the hole. We suppress the impact ionization of a carrier by creating a superlattice in the valence band when the carrier is a hole (see FIG. 1) and with a superlattice in the conduction band when the carrier is an electron (see FIG. 5). A non-cryogenic temperature may be warmer than, for example, minus 50 degrees C.

Thus, the linear mode APD 100, 500 with the matched superlattice structure is configured in the superlattice multiplication region to suppress the impact ionization of the first carrier i) by implementing a superlattice in a valence band when the first carrier is a hole and ii) by implementing a superlattice in a conduction band when the first carrier is an electron. The gain from impact ionization can only be initiated by the other carrier with kinetic energy (KE) greater than the bandgap energy (Eg), through the use of a matched superlattice; as well as, the first carrier, either the electron or the hole, is prevented from accumulating enough kinetic energy under an electric field large to impact ionize.

A cooperation exists between the superlattice structure and the voltage controller for the fixed or variable electric field applied to the superlattice structure. A periodic structure of layers of two or more materials forming the matched superlattice structure is designed to have at least one quantum state in each of its wells when the superlattice is biased by a voltage controller to have an electric field that would sustain impact ionization in a thick layer of a well semiconductor or a barrier semiconductor alone. The periodic set of materials for the matched superlattice structure is designed also to have a large spatial overlap of wavefunctions of the quantum states of adjacent wells when under an applied bias such that the first carrier traverses the superlattice by hopping from a first well to a second well and substantially loses an amount of energy supplied by the applied bias to end up being less than a kinetic energy needed to impact ionize to form a new electron-hole pair for each hop from well to well. A range of bias from the voltage controller will facilitate these objectives.

The large spatial overlap promotes the rapid decay of a carrier in the localized state of a particular well into the lower energy localized state of the adjacent state. This process is known as hopping. The energy difference is lost to the emission of phonons. The carrier traverses the superlattice by hopping from one well to the next well and losing the energy supplied by the applied bias to phonons at every step.

The matched superlattice structure in the multiplication region can give band discontinuity in only one band (gain without noise) via the matched materials that can have 100's of periodic sets of nanometer-thick layers to allow precise shaping of the band energy structure. The materials forming the matched superlattice structure in the multiplication region periodically repeat.

The linear mode APD 100, 500 with the matched superlattice structure is matched to suppress the impact ionization for only the first carrier in the superlattice multiplication region by using a periodic structure of layers of two or more materials grown on a substrate that can be chosen from lattice matched pairs of semiconductors to form the superlattice structure. The lattice matched pairs have their band offsets set to i) at least mostly be in a band corresponding to the suppressed carrier and ii) up to entirely be in the band corresponding to the suppressed carrier where impact ionization is to be suppressed. The lattice matched pairs of semiconductors forming a period of the superlattice structure consists of at least one pair of alternating layers of a first semiconductor material and a second semiconductor material. The superlattice consists of a repetition of multiple periods where the corresponding thicknesses of each layer of a period are the same. All of the layers of the first semiconductor have substantially a same thickness without doping. All of the layers of the second semiconductor have substantially a same thickness without doping. However, the thickness of the layers of the first semiconductor can be different than the thickness of the layers of the second semiconductor.

Note, the unsuppressed carrier in the other band will not be in a superlattice at low energy, so its transport will proceed qualitatively as if were in a bulk semiconductor. The unsuppressed carrier in the other band will impact ionize to provide the gain needed for the linear mode APD. With the impact ionization occurring in the opposite band of the first carrier being suppressed, then the excess noise will be eliminated.

The linear mode APD 100, 500 with the matched superlattice can operate over a wide range of light detection including across UV, Visible, and Short-wave IR (~2500 nm) light waves.

In an embodiment, the linear mode APD 100, 500 can detect single photons with high quantum efficiency near room temperature. However, previous photodetectors without a matched superlattice, the noise they generate can overwhelm the detection signal from the photons. The linear mode APD 100, 500 with the matched superlattice can detect a single photon without a penalty of having a deadtime after the detection of the single photon where the linear mode avalanche photodiode cannot detect another photon until after a set period of time. Thus, no pixel "dead-time" upon a detection event (="real-time" data acquisition.) The linear mode avalanche photodiode with the matched superlattice multiplies photocurrent above the noise-equivalent input current of the electronics that will amplify the signal of a single photon to a measurable voltage while adding very little noise in the multiplication process.

The APD 100, 500 with a matched superlattice behaves as a linear amplifier so, in contrast to a Geiger mode APD, the linear mode APD 100, 500 with a matched superlattice can resolve the near simultaneous arrival of multiple photons and it does not have a dead time after it detects a photon. The APD 100, 500 can deliver a room-temperature, InP-based, linear mode APD with a gain of $10^4$ electrons per photon, low excess noise, and high quantum efficiency that will achieve the ultimate in detector sensitivity. The linear mode APD 100, 500 with the matched superlattice can simultaneously achieve single-photon sensitivity at or greater than, for example, room temperature, with no dead time and minimal excess noise.

Next, typically, a general APD has a large internal gain, M, that can potentially multiply the photocurrent tremendously. However, its performance has been disappointing because the noise added by the multiplication process, known as excess noise, overwhelms the amplified signal even at a modest value of M≈_50. The origin of the excess noise the simultaneous presence of electron-initiated impact ionization and hole-initiated impact ionization. Together, they create a positive feedback loop that magnifies small fluctuations in the impact ionization process. Two parameters used to characterize an APD are the electron-initiated impact ionization coefficient $\alpha$_and the hole-initiated impact-ionization coefficient $\beta$. The excess noise factor, F, is ≤_2 for all values of M when either $\alpha_-$ or $\beta_-$ is zero (unipolar gain), but F is proportional to M for large M for bipolar gain (see FIG. 3).

Figure 3:
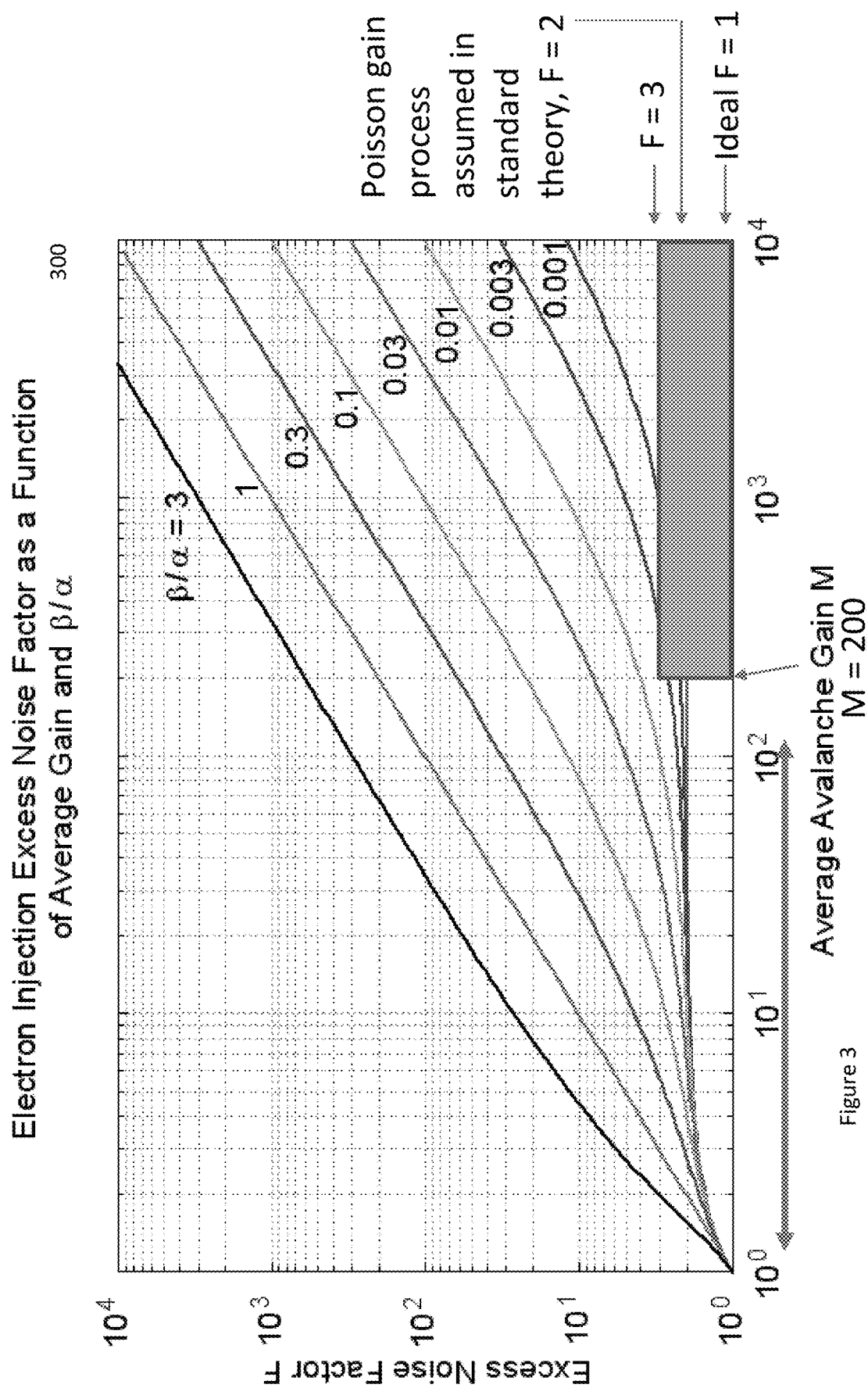
FIG. 3 illustrates an embodiment of a graph of a theoretical value of the excess noise factor F as a function of the average gain M and the $\beta/\alpha$ ratio for an electron injection.

FIG. 3 illustrates a graph 300 of a theoretical value of the excess noise factor F as a function of the average gain M and the $\beta/\alpha$ ratio for an electron injection. The $\beta/\alpha$ curve of 0.03 is the current best value for an APD at room temperature. The $\beta/\alpha$ curve shows that for M>50, F grows with increasing M. The matched superlattice can have a $\beta/\alpha_- \ll 10^{-4}$.

A linear mode APD with the matched superlattice has a unipolar gain and will behave like a photomultiplier tube (PMT) but with the tremendous system advantages in area occupied by the device and of a ruggedness associated with the semiconductor device. By providing high gain with low noise within the detector, the unipolar gain APD can photon count in the linear mode—its output can be coupled to commercially available electronic amplifiers to give a waveform in which the arrival of a single photon is detectable above the noise and in which the simultaneous arrival of multiple photons can be distinguished.

Without a room-temperature APD technology that can provide enough low-excess-noise gain for linear-mode photon counting, the alternative is photon counting in the Geiger mode. In this mode, the APD is biased above its breakdown voltage to a metastable state in which no current flows until it is triggered by the arrival of a single photon or by dark current. Once triggered, the APD current rapidly grows to a value that can be easily detected. While the Geiger mode APD is capable of single-photon detection, it has two serious drawbacks: (1) it has a dead time of ~100 nanoseconds and longer after it is triggered and during which it has no photo response; and (2) it has after pulsing—the re-emission of carriers captured by trap states during the avalanche that gives a higher dark count rate for many microseconds after being triggered. The first of these increases the false-negative rate and the second the false-positive rate for applications, such as LIDAR, in which the arrival of the signal photons is clustered in time.

Next, FIGS. 1 and 5 show a linear mode APD 100, 500 with a matched superlattice structure in which the excess noise is substantially eliminated by creating an enormous asymmetry between the electron and the hole transport. The superlattice structure has a set of materials with the desirable unipolar impact ionization using constituents that do not have any special impact-ionization properties; and thus, can be potentially employed for APDs 100, 500 spanning material system that collectively are used to detect a wide range of wavelengths. The gain region is composed of two or more lattice-matched semiconductor alloys. The matched two or more lattice-matched semiconductor alloys have the property that their entire band offset is only in either the valence band or the conduction band. See FIGS. 1 and 5 for band offset is only in either the valence band or the conduction band.

Figure 2A:
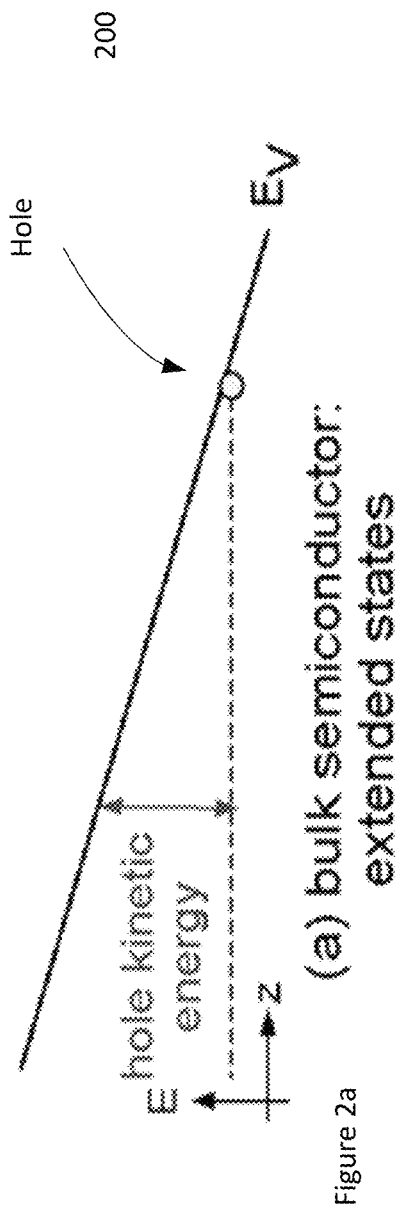
FIG. 2a illustrates an embodiment of a graph of a hole in the valence band of a bulk semiconductor under bias accruing kinetic energy with distance.
Figure 2B:
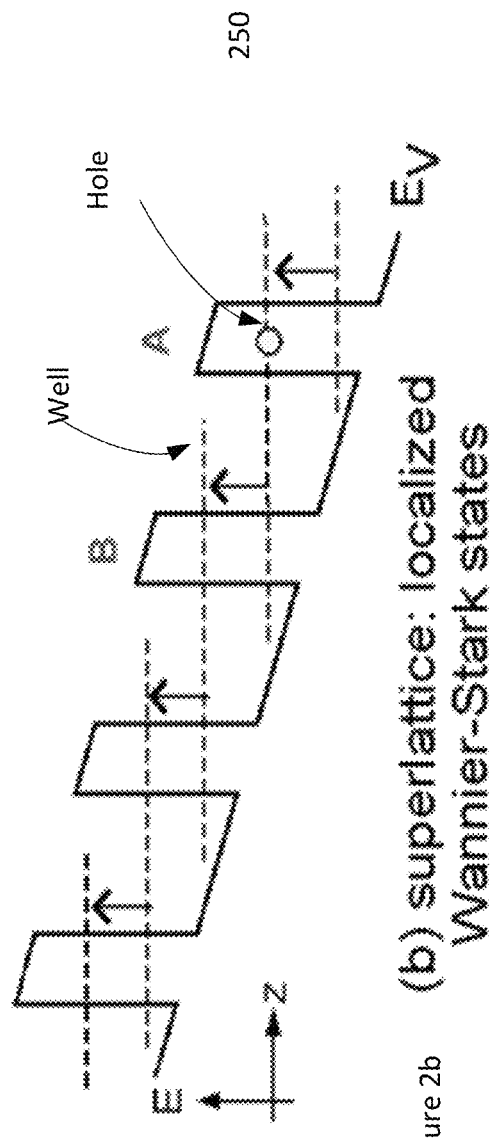
FIG. 2b illustrates an embodiment of a graph of a hole in the valence band hopping through wells in a biased superlattice and the energy levels for states in a Wannier-Stark ladder.

FIG. 2a illustrates an embodiment of a graph of a hole in the valence band of a bulk semiconductor under bias accruing kinetic energy with distance. FIG. 2b illustrates an embodiment of a graph of a hole in the valence band hopping through wells in a biased superlattice and the energy levels for states in a Wannier-Stark ladder. FIGS. 1, 2a, and 2b show gain from electron multiplication only with the superlattice in the valence band. Similarly, FIGS. 5, 6a, 6b, and 7 shows gain from hole multiplication only with the superlattice being in the conduction band instead of valence band.

Impact Ionization in APDs

Figure 4:
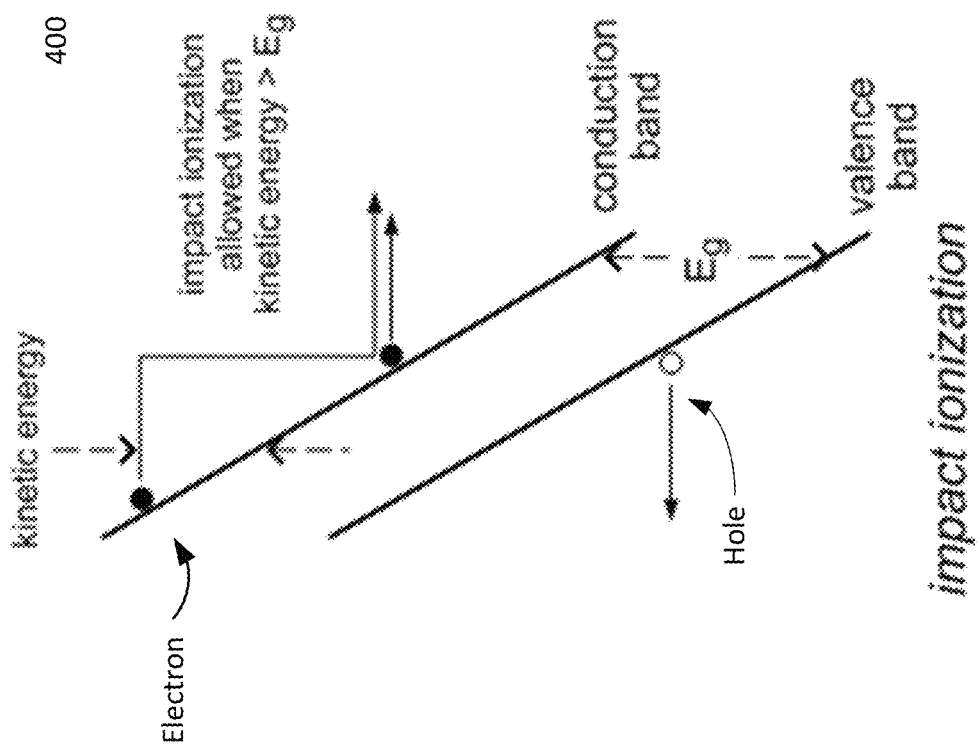
FIG. 4 illustrates an embodiment of a graph of the band diagram of a semiconductor where energy is plotted vertically and distance horizontally and an amount of kinetic energy needed to impact ionize to form a new electron-hole pair.

FIG. 4 shows a band graph 400 of a semiconductor where energy is plotted vertically and distance horizontally and an amount of kinetic energy needed to impact ionize to form a new electron-hole pair. Free electrons reside in the conduction band and free holes in the valence band. The conduction band and the valence band are separated by the bandgap of width Eg where there are no allowed electron or hole states. With an applied electric field, the bands are tilted in proportion to the magnitude of the field as shown in FIG. 4. The electron at the top left travels to the right as it is accelerated by the applied field. The vertical distance between the electron's instantaneous position and the conduction band is the instantaneous kinetic energy of the electron. Once the kinetic energy of the electron exceeds the bandgap energy, it has enough energy to create an electron-hole pair by impact ionization. When the electron does impact ionize, most of the kinetic energy goes into creating an electron-hole pair and results in two electrons and one hole with very little kinetic energy. Electron-initiated impact ionization is characterized by a coefficient $\alpha$, the average number of electron-initiated impact ionization per centimeter (See FIG. 1).

A similar chain of events can happen in the valence band with a hole accelerating to create an electron-hole pair. In this case, there are two holes and one electron after the hole-initiated impact ionization (See FIG. 5). This process is characterized by the hole-initiated impact ionization coefficient $\beta$.

FIG. 1 shows the graphs of the two bands overlaid on the superlattice multiplication region. Both electrons and holes are accelerated by the electric field, so both will initiate the creation of a new electron-hole pair by impact ionization. The general case will be discussed in the next section, but the case where $\beta=0$ can be easily understood. A single electron impact ionizes, resulting in two electrons and a hole. The two electrons each accelerate and leave four electrons after impact ionization. The four electrons become eight, etc., etc., so the number of electrons grow exponentially with distance z as $e^{\alpha z}$. The number of holes also grows exponentially since a hole is created every time an electron is created. Since these holes do not impact ionize when $\beta=0$, they do not increase the number of electrons. So when $\beta=0$, the semiconductor provides an exponential gain $e^{\alpha z}$ with the only noise arising from variations in the distance an electron travels before it impact ionizes. Similarly, $\alpha=0$ gives an exponential gain $e^{\beta z}$.

Excess Noise in APDs

In some previous techniques, for most semiconductors, the value of $\alpha$ and of $\beta$ are very similar so the simple case of exponential gain does not hold. Consider the case where a photogenerated electron is injected from the absorption layer into a biased semiconductor layer at z=0 and initiates the first impact ionization at $z=z_0$.

A second electron and a hole are generated by the impact ionization. The hole, having the opposite charge as an electron, drifts in the opposite direction as the electrons and will impact ionize to create a new electron-hole pair at $z=z_1$ somewhere between z=0 and $z=z_0$ if it does not reach the end of the semiconductor layer first. There is some random variation in how far the hole drifts before it impact ionizes because of randomness in where and when it scatters with a crystal defect or a phonon. These variations can make a large difference near the end of the layer by determining whether or not the hole impact ionizes just before reaching the end. The newly generated electron at $z=z_1$ will drift toward $z=z_0$, perhaps impact ionizing along the way to create more electron-hole pairs. Even without considering the electron-hole pairs that the two electrons emerging from the first impact ionization will subsequently generate, it should be clear that the single initial photoelectron impact ionizing at $z=z_0$ generates subsequent electrons passing through $z=z_0$. However, it is impossible to distinguish if a second electron passing though $z=z_0$ is a byproduct of the initial photoelectron generated by the sequence of impact ionization as just described or is a second photoelectron injected into the layer. The signal in the first situation is due to the injection of only the initial electron and in the second situation is due to the injection of two electrons at slightly different times. Since the impact ionization obscures the difference between these possible inputs, the process adds noise to the signal. This noise is known as excess noise. Excess noise in APDs has been well studied.

FIG. 3 shows the excess noise factor F as a function of $\beta/\alpha$ and the average APD gain M for electron injection into the gain region. The $\beta/\alpha=0$ curve gives the lowest F for all M and it is the $\beta=0$ case we described above. The result that F has a value of 2 rather than a value of 1 expected for the ideal case is due to an assumption made in the calculations that the impact ionization is a Poisson process. As $\beta/\alpha$ increases, the excess noise factor remains at F=2 at low M but increases at high M. Closer inspection of the curves yields the the rule that to achieve a gain M with F=3 requires that $\alpha/\beta \approx M$. Achieving a gain of $10^4$, enough to detect single photons under some conditions, with little excess noise requires a semiconductor with $\beta/\alpha=10^{-4}$. So far, no single component semiconductor with this large of a difference between $\alpha$ and $\beta$ is known, so an engineered material with alloys is needed to achieve this difference and to achieve gain being initiated for merely first carrier type (an electron or a hole.)

In FIG. 3 as F gets large, then M gets large, unless alpha/beta or beta/alpha gets very small. The current design is how to make a very small alpha/beta or beta/alpha and thus get a small F for a large M.

Another consequence of simultaneously having $\alpha \neq 0$ and $\beta \neq 0$ is avalanche breakdown. Breakdown occurs when the number of electrons or holes becomes arbitrarily large for a finite voltage and for a multiplication region of finite size. As discussed earlier for $\alpha=0$ or $\beta=0$, the number of electrons and holes grow exponentially with z. This number, although it is growing rapidly, remains finite for finite voltage (implying that $\alpha$ and $\beta$ remain finite) and for finite size (implying z remains finite).

However, the situation changes when $\alpha \neq 0$ and $\beta \neq 0$. Suppose that a single electron is injected into the multiplication region at z=0 and initiates an impact ionization at $z=z_1$. The hole created at this impact ionization drifts in the −z-direction and can impact ionize before arriving at the end of the multiplication region at z=0. When it does, it creates an electron at z somewhere between 0 and $z_1$. This is exactly the initial situation repeated at a later time. At the threshold of breakdown, loops such as this become self-sustaining so that a single injected electron produces an infinite number of subsequent electrons. In this simplified picture where we considered only the first impact ionization initialized by each carrier, the build-up of carriers occurs exponentially with time. A more realistic picture that considers all impact ionizations would give a much faster increase with time.

As discussed, the linear mode avalanche photodiode senses photons and outputs electrical current by being configured to generate a gain equal to or greater than 1000 times ($10^3$) amplification while generating an excess noise of less than 3 times a thermal noise present ($\beta/\alpha<=0.1$) at or above a non-cryogenic temperature due to the gain from the amplification. (See the shaded area of operation in the lower right hand portion of FIG. 3) In an embodiment, the minimum useable gain may span being equal to or greater than 200 times amplification while generating an excess noise of less than three times a thermal noise present.

In an embodiment, the linear mode avalanche photodiode with the matched superlattice structure such that amplification occurs in merely i) the conduction band or ii) the valance band is configured to generate a gain of equal to or greater than 10,000 times ($10^4$) amplification while generating an excess noise of less than three times the thermal noise present at or above a room temperature due to the gain from the amplification. ($\beta/\alpha<=0.1$) The linear mode avalanche photodiode with the matched superlattice structure with the gain of 10,000 times amplification is capable of detecting a single photon without a penalty of having a deadtime after the detection of the single photon where the linear mode avalanche photodiode cannot detect another photon until after a set period of time. (Thus, no pixel "dead-time" upon a detection event (="real-time" data acquisition"). With the deadtime, a waveform captured by an APD will have a gap in time after the detection of each photon where a subsequent photon cannot be detected.

FIGS. 2a and 2b illustrate a comparison of hole transport in a biased bulk semiconductor, and in a biased superlattice. Referring to the graph 200 in FIG. 2a, in the bulk semiconductor, the electric field accelerates the hole to the left in an extended state. The kinetic energy of the hole increases as it is accelerated until it has enough energy to impact ionize. Referring to the graph 250 in FIG. 2b, the allowed states in a biased superlattice are Wannier-Stark states that are mainly in one well but extend to a few wells to the left. The ground state of the well A is also the first excited state of the well B. A hole in this extended state can relax into the ground state of well B by emitting a phonon or photon. In this way, a hole can be transported leftward while remaining in the local ground state and never having enough energy to impact ionize.

As shown in FIGS. 1, 2b, 5, 6b, and 7, a superlattice of, for example, two matched alloys will have wells and barriers in one band but not the other, so carrier transport in the two bands will be very different. Transport in the band with the offset will be by hopping (also known as phonon-assisted tunneling) from a state localized at one well to a state localized in an adjacent well. The energy imparted to the carrier by the applied electric field dissipates through phonons or through midwave or longwave infrared photons so that the carrier does not accumulate enough kinetic energy to impact ionize. Therefore, the superlattice has $\beta=0$.

A carrier in the band without the offset does not have the localized states needed for hopping. So, as in an ordinary semiconductor under bias, it is in an extended state where it accumulates kinetic energy as it drifts in the electric field, and it impact ionizes when its kinetic energy exceeds the bandgap energy (see FIGS. 1, 4, and 5). The matched linear mode APD structure has a large asymmetry between the ability of the electron and hole to impact ionize and can give an APD 100, 500 with high gain (>$10^4$) with low excess noise (F<2) at room temperature.

From the above discussion, exponential gain free of excess noise can occur when $\alpha=0$ or $\beta=0$. To do this, note that impact ionization can only be initiated by a carrier with kinetic energy greater than the bandgap energy. The matched superlattice structure prevents either the electron or the hole from accumulating enough kinetic energy under an electric field large enough that the opposite carrier can accumulate the kinetic energy to impact ionize. Thus, the gain from impact ionization can only be initiated by a carrier with kinetic energy greater than the bandgap energy through the use of a matched superlattice in which the superlattice structure causes either the electron or the hole to be prevented from accumulating enough kinetic energy under an electric field that is large enough that the opposite carrier can accumulate the kinetic energy needed in order to impact ionize.

The matched linear mode APD 100, 500 eliminates excess noise by suppressing the impact ionization for first carrier while maintaining it for the other carrier. Attempts to make a linear mode APD with a large or small α/β are based on enhancing the impact ionization for first carrier while maintaining it for the other. For a given fractional change in the impact ionization rate of first carrier, using it for suppression gives a greater change in α/β. For example, increasing the impact ionization rate of a carrier by 50% increases α/β by a factor of 3/2 while decreasing the impact ionization rate by 50% increases β/α by a factor of 2.

Similar to the hole discussion in FIGS. 2a and 2b, FIG. 6a illustrates an embodiment of a graph 600 of an electron in bulk semiconductor with an applied electric field that is accelerated by the field and accumulates kinetic energy. FIG. 6b illustrates an embodiment of a graph 650 of the matched superlattice suppresses impact ionization by controlling the localized Wannier Stark states. A superlattice can be a periodic structure of layers of two or more materials. Typically, the thickness of a layer of material may be indicated in nanometers. With the appropriate band offset and layer thicknesses, the superlattice under electrical bias forms Wannier-Stark states that are mostly localized to a single well. The energy level of these states is indicated by the dashed lines and their wavefunction by the filled shaded curves. A continuum of extended states in which an electron can accelerate in the field exists at energies above the barrier energy. It is imperative that electrons be prevented from occupying the continuum. With proper design of the superlattice, the Wannier-Stark states and the continuum are separated by many kT of energy. Thus, electrons in the Wannier-Stark states are unlikely to be thermally excited into the continuum where they can be accelerated by the electric field.

Note that for an electron in the Wannier-Stark state in well 0, the state in well 1 is at lower energy and is therefore is more favorable. The electron can make the transition from well 0 to well 1 by emitting phonons or a photon to conserve energy; this process is known as hopping. The probability of hopping is proportional to the overlap of the well 0 wavefunction and the well 1 wavefunction. Thinner wells and barriers and a smaller difference between the barrier and well conduction band levels lead to larger overlaps but can convert the localized states back to the extended states that we are trying to eliminate. An electron hopping from the well 0 state to the well 1 state accomplishes two useful functions. An electron hopping from the well 0 state to the well 1 state moves the electron by one superlattice period 'a' in the z-direction and it removes an energy of qEa from the electron, where q is the electron charge and E is the applied electric field. This is exactly the kinetic energy that the field imparts to a charge q over a distance 'a' in the bulk semiconductor. The electron in the superlattice has moved a distance a in a field without changing its kinetic energy. Once the electron is in well 1, the electron can hop to well 2 and then to well 3, etc., without acquiring the kinetic energy needed to impact ionize.

The thickness of the well and barrier layers are determined with these design goals: Wannier-Stark states are formed at the applied electric field required to give the desired carrier multiplication, the energy level of the Wannier-Stark states are low enough in the wells that carriers are not thermally excited into the continuum, and the states in adjacent wells have a large overlap so hopping can be fast.

The above discussion suppresses electron-initiated impact ionization with a superlattice in the conduction band; and accordingly, hole-initiated impact ionization can be suppressed in a similar way with a superlattice in the valence band (See FIGS. 2b and 1). Note though, suppressing impact ionization in one band with a superlattice is half the solution to eliminate excess noise in an APD. Picking any two semiconductors, one for the well and one for the barrier, without special consideration will very likely lead to a superlattice in both the valence and the conduction band. Impact ionization will be suppressed in one band by design, but impact ionization in the other band may also be suppressed or at least reduced. So, it will be advantageous to choose a pair of semiconductors where the band offsets are entirely in the band where impact ionization is to be suppressed.

The other band will have no offset and will behave approximately like a bulk semiconductor. However, there are two major differences. First, the impact ionization coefficient of the two materials will likely be different. Its effective impact ionization coefficient will be somewhere between the coefficients of the individual bulk semiconductors. Second, the carrier effective mass will likely be different. The effective mass superlattice will have no wells and barriers for carriers near the □ point in reciprocal space.

The unsuppressed band in a superlattice where the semiconductor pair band offset is entirely in the suppressed band will still have different effective masses for the two layers. Therefore, it forms an effective mass superlattice where there are no wells for a carrier with little kinetic energy (near the gamma point in reciprocal space) but where wells gradually form as the carrier acquires kinetic energy. Depending on the details of the materials forming the superlattice, the conduction band wells may be in the same layer as the valence band wells (Type I alignment) or in opposite layers (Type II alignment). In the worst case for an APD, the appearance of an effective mass superlattice can begin suppressing carriers in the unsuppressed band. This effect can be ameliorated by choosing a band offset such that the effective mass superlattice disappears for carriers with some intermediate kinetic energy.

Next, again, FIG. 1 shows the graphs of the two bands overlaid on the superlattice multiplication region. The superlattice is set to be entirely in the Ev Valence band (thus, multiplying electrons but not holes). Therefore, the Ec Conduction band is essentially a straight line sloping downwards. FIG. 1 shows an Epitaxial structure and energy band diagram of the proposed APD 100 under reverse bias. A photon (red wavy arrow) is absorbed in the p-InGaAs absorption layer, creating an electron (black circle) —hole (white circle) pair. The hole diffuses to the p-InP cap layer, and the electron diffuses to the multiplication. The electron is accelerated by the electric field until it accumulates enough kinetic energy to impact ionize a secondary electron-hole pair. Each electron then accelerates until it creates another electron-hole pair. Because the impact-ionization-generated holes lose kinetic energy as they hop through the valence band superlattice, they cannot impact ionize. Thus, an enormous asymmetry in α_and β_is created.

Unusual as the one-sided band alignment may seem, there are several pairs that are lattice-matched to either the III-V (where III and V respectively refer to columns IIIB and VB of the periodic table) semiconductor substrates InP or GaSb. A promising pair is InP and In0.53Al0.30Ga0.17As, in which both alloys are routinely grown. The alloy consists of 53% In, 30% Al, 17% of Ga for the group III components, and entirely As for the group V component. FIG. 1 shows an APD 100 built around the InP—InAlGaAs multiplication layer for multiplication of electrons by impact ionization without the concurrent multiplication of holes. Electrons photogenerated with high quantum efficiency in the InGaAs absorption layer are injected into the multiplication layer. These electrons impact ionize as they traverse through the multiplication region. Secondary electrons can also impact ionize, but secondary holes cannot impact ionize because they lose their kinetic energy as they hop from one quantum well to the next. The multiplication of electrons by impact ionization without the concurrent multiplication of holes results in an exponential growth of each of the original photoelectron with low excess noise.

An arduous systematic search was conducted for matched pairs of semiconductors where the band offset is entirely in either the valence band or the conduction band. A constraint for this semiconductor device can be that all of the semiconductor layers in a device with state-of-the-art performance need to have a crystal structure with the same type and the same dimensions as that of the substrate. This constraint is known as lattice-matching. Without lattice-matching, crystal defects originating at the interface between layers degrade performance. So our search for appropriate pairs needed to be performed separately for each substrate of interest. For linear mode APDs in the near infrared and shortwave infrared (approximately 0.8-3 μm wavelength), the most interesting substrates are InP and GaSb.

For these two substrates, InP and GaSb, we estimated the conduction band energy and the valence band energy for all lattice-matched alloys that the current epitaxial growth technologies would be able to grow. For pairs with either equal conduction band energy or valence band energy, we tend away from those where with an alloy that consists of more than four elements since it would be difficult to control the stoichiometry, those with an alloy that has an indirect bandgap, and those with an alloy known to phase separate.

The search yielded cases where an alloy $A_1(x_1)$ that depends on a parameter $x_1$ characterizing the composition of the alloy over a range of $x_1$ will have either the same conduction band energy or valence band energy as a second alloy $A_2(x_2)$ over a range of $x_2$. We found that the equal conduction or valence band condition is met over a range of $x_1$ that is synchronized with that of $x_2$. Within such a range, the endpoints of the range are most interesting because the band offset of the unequal band is maximized there.

Specific alloy pairs are given below. In the cases where the conduction or valence band energies can be the same over a range, we give pairs that has the largest band offset for the unequal band for that range.

We have found semiconductor pairs that are useful for the linear mode APD design both in terms of having the correct properties and in terms of being practical to do the epitaxial growth of the pair.

InP Substrate

The superlattice structure has lattice matched pairs of semiconductors in the superlattice multiplication region, and the lattice matched pairs are also matched to an InP substrate, where the lattice matched pairs are selected from a group consisting of:

two semiconductors in the superlattice structure with a first semiconductor alloy of InP and a second semiconductor alloy of $In_{0.53}Al_{0.30}Ga_{0.17}As$ with the superlattice being set in a valence band, where the hole is the first carrier;

two semiconductors in the superlattice structure with a first semiconductor alloy of InP and a second semiconductor alloy of $In_{0.19}Ga_{0.81}As_{0.69}Sb_{0.31}$ with the superlattice being set in a valence band, where the hole is the first carrier;

two semiconductors in the superlattice structure with a first semiconductor alloy of InP and a second semiconductor alloy of $GaAs_{0.12}Sb_{0.61}P_{0.27}$ with the superlattice being set in a valence band, where the hole is the first carrier;

two semiconductors in the superlattice structure with a first semiconductor alloy of $In_{0.81}Ga_{0.19}As_{0.42}P_{0.58}$ and a second semiconductor alloy of $In_{0.37}Ga_{0.63}As_{0.85}Sb_{0.15}$ with the superlattice being set in a valence band, where the hole is the first carrier;

two semiconductors in the superlattice structure with a first semiconductor alloy of $In_{0.94}Ga_{0.07}As_{0.12}P_{0.88}$ and a second semiconductor alloy of $GaSb_{0.65}P_{0.35}$ with the superlattice set in a valence band, where the hole is the first carrier; or two semiconductors in the superlattice structure with a first semiconductor alloy of $In_{0.52}Al_{0.48}As$ and a second semiconductor alloy of $In_{0.79}Ga_{0.21}As_{0.46}P_{0.54}$ with the superlattice being set in a conduction band, where the electron is the first carrier.

GaSb Substrate

The superlattice structure has lattice matched pairs of semiconductors in the superlattice multiplication region, and the lattice matched pairs are also matched to an GaSb substrate, where the lattice matched pairs are selected from a group consisting of two semiconductors in the superlattice structure with a first semiconductor alloy of GaSb and a second semiconductor alloy of $In_{0.57}Al_{0.43}As_{0.55}Sb_{0.45}$ with the superlattice being set in the valence band, where the hole is the first carrier;

two semiconductors in the superlattice structure with a first semiconductor alloy of $Al_{0.14}Ga_{0.86}As_{0.01}Sb_{0.99}$ and a second semiconductor alloy of $In_{0.09}Ga_{0.91}As_{0.08}Sb_{0.92}$ with the superlattice being set in the conduction band, where the electron is the first carrier;

two semiconductors in the superlattice structure with a first semiconductor alloy of $Al_{0.44}Ga_{0.56}As_{0.04}Sb_{0.96}$ and a second semiconductor alloy of $In_{0.28}Ga_{0.72}As_{0.26}Sb_{0.74}$ with superlattice being set in the conduction band, where the electron is the first carrier; or two semiconductors in the superlattice structure with a first semiconductor alloy of $In_{0.40}Al_{0.60}As_{0.42}Sb_{0.58}$ and a second semiconductor alloy of $In_{0.79}Ga_{0.21}As_{0.72}Sb_{0.28}$ with superlattice being set in the conduction band, where the electron is the first carrier.

These compositions are approximate since the properties of the alloys are based on measurements made with varying uncertainties by many laboratories.

Recognizing that these may be difficult to grow because of unintentional intermixing of the two alloys at the interface, we consider methods that would relax the constraint on the structure without adversely affecting the physical principles of the device.

The principle we use is that the offset does not have to be completely eliminated in one of the bands. The offset only has to be small enough that for the design layer thicknesses there are no confined states less than kBT away from the continuum in that band, where kB is the Boltzmann constant and T is the intended operating temperature. In the case of the valence band, it is enough to consider only heavy hole states because elimination of the heavy hole confined states automatically eliminates the light hole confined states.

1. Including a Spacer Layer Between the Well and Barrier

For definiteness, we discussed the example alloy layers comprising of $In_{0.52}Al_{0.48}As$ barriers and $In_{0.79}Ga_{0.21}As_{0.46}P_{0.54}$ wells as an example. Rough surface morphology and low photoluminescence may be a result of unintentional formation of AlP at the interfaces of the InGaAsP—InAlAs superlattice. A lattice-matched spacer layer of InGaAs(P), which contains less P than the 54% in the well layer, inserted between the well and barrier layers will reduce AlP formation by having the Al-containing layer be adjacent to a P-containing layer with lower P content than the well. The spacer will have little effect on the valence band if its valence band offset is small enough and it is thin enough that any confined hole. An $In_{0.53}Ga_{0.47}As$ spacer that is lattice-matched to InP is obviously the best spacer for preventing AlP formation, but the worst in terms of forming a valence band well.

Because the growth defines a direction to the superlattice, placing the spacer immediately after the growth of the InAlAs barrier layer is not equivalent to placing it immediately after the InGaAsP well layer. Starting with a baseline superlattice of 3.5 nm InGaAsP wells and 1.5 nm InAlAs barriers, we modeled three modified superlattice periods (last layer listed is grown first) (a) InGaAs(P)—InGaAsP—InAlAs, (b) InGaAsP—InGaAs(P)—InAlAs and (c) InGaAs(P)—InGaAsP—InGaAs(P)—InAlAs. We kept the InAlAs barrier layer constant at the original thickness of 1.5 nm and the sum of thickness of the other layers at the original well thickness of 3.5 nm. The spacer is 1.5 nm thick for Cases (a) and (b), and each spacer is 0.5 nm thick for Case (c). The InGaAs(P) spacer layer was modeled for 0%, 13%, 27% or 40% P content with the other components of the layer adjusted to maintain lattice-matching to InP. The modeling indicated that a spacer layer requires at least 13% P to prevent quantum confinement of holes for Case (a), at least 27% P for Case (b) and at least 40% P for Case (c). The effectiveness of a spacer layer with more than 40% P to prevent AlP formation and the ability to grow 0.5 nm layers are questionable, so Cases (a) and (b) would be promising candidates to reduce intermixing at the interface. Since only half of the interfaces will have a spacer for this example, it will work best if the intermixing occurs primarily in the InAlAs on InGaAsP or the InGaAsP on InAlAs interface.

2. All-Arsenide Superlattice Structure

Growth of a superlattice is more difficult the more atomic fractions that have to be changed in going from one layer to the next. A superlattice where both the well and the barrier are pure phosphides, pure arsenides or pure antimonides would be easier to grow than any of the ten listed above.

As an example of this, we consider the possibility of growing an all-arsenide lattice-matched superlattice with the relaxed property that the wells have localize quantum states in one of the bands but not in the other. InGaAlAs wells and InAlAs barriers did not seem promising because both the electron and the heavy hole were confined for layer thicknesses that are practical to grow. But a superlattice with a coupled well for each period appeared to be a way to decouple the electron and the heavy hole confinement: the electric field pushes the electron to, say, the right coupled well while it pushes the heavy hole to the left coupled well. With coupled wells, the right well parameters will have a larger effect on the electron and the left well parameters will have a greater effect on the heavy hole. A superlattice with a period consisting of 1.5 nm Q-1.5 nm InAlAs-3.0 nm Q-1.5 nm InAlAs where $Q=In_{0.53}Ga_{0.23}Al_{0.24}As$ and InAlAs=$In_{0.52}Al_{0.48}As$ has confined electronic states with good well-to-well wavefunction overlap and no confined heavy hole states.

The superlattice where electrons or holes are suppressed consists of alternating layers of alloy 'A' and alloy 'B' selected from the pairs listed above. All 'A' layers have the same thickness and all 'B' layers have the same thickness that may or may not be the same as the 'A' layer thickness.

As an alternative design to FIG. 1, FIGS. 5, 6b, and 7 show a linear mode APD 500 with a matched superlattice design where electron multiplication, but not the hole multiplication, is suppressed. Electron cannot accumulate enough kinetic energy to initiate multiplication. Only holes can initiate gain and cause potential exponential multiplication. Excess noise in APDs arises from simultaneous electron and hole multiplication. However, suppressing multiplication of either electrons and holes minimizes noise while providing gain. The matched superlattice achieves multiplication of carrier at non-cryogenic temperatures such as room temperature of 30-50 C, and even at temperatures above this range. The superlattice is designed to have at least one quantum state in each of its well when it is biased to have an electric field that would sustain impact ionization in a thick layer of the well semiconductor or the barrier semiconductor alone. In the case of a valence band superlattice, there should be at least one quantum state for the light hole and one quantum state for the heavy hole.

Next, to suppress the impact ionization for first carrier only, the design can chose pairs of semiconductors with their band offset mostly in the band corresponding to the suppressed carrier. The band offset of the superlattice pair does not have to be entirely in the band corresponding to the suppressed carrier. There can be enough offset in the opposite band as long as the offset is not sufficient to support quantum states at the well and barrier thicknesses of the superlattice. This gives tolerance in the superlattice composition.

Graphically see FIG. 5, when the superlattice is set to be entirely in the Ec Conduction band (thus, multiplying holes but not electrons), the Ev Valance band is essentially a straight line sloping downwards. However, the coefficients of the materials can be matched to place the materials mostly in one band, for example, the Conduction band but potentially not entirely in that one band. Visually that would mean the other band, the Valance band would not be a solid straight line but a generally straight line with occasional small little pulses which are not deep enough to form a well. Thus, when the band offset of the superlattice pair is mostly set in the band corresponding to the suppressed carrier, then the other carrier's band can have enough offset as long as the offset is not sufficient to support quantum states at a thickness of i) a well layer, ii) a barrier layer, or iii) either the well layer or the barrier layer of the superlattice.

Additional Benefits of a Room-Temperature Linear Mode APD with a Matched Superlattice Structure The proposed APD will be capable of operating as a low-noise photocurrent amplifier with enough gain to enable capture of the photocurrent waveform with single-photon sensitivity when its output is coupled into commercially available electronic amplifiers. This device will achieve the ultimate detector sensitivity at room temperature by detecting single photons at high quantum efficiency over a large band of wavelengths.

The proposed device will not require Geiger mode operation to detect single photons. To illustrate the consequence of this, an array of SRI's linear mode APDs can acquire a full three-dimensional point-cloud LIDAR image from a single shot of the laser. (See FIGS. 8 and 9) In contrast, an array of Geiger mode APDs requires a laser shot for each of the N range bins, increasing the acquisition time and laser energy N-fold.

Various Implementations to Suppress Electron- or Hole-Initiated Impact Ionization A choice that needs to be made is whether we want to suppress electron- or hole-initiated impact ionization. For example, a conduction band only superlattice and/or a valence band only superlattice. A major factor influencing this choice is the likelihood that the impact ionization generates the suppressed carrier in a continuum state rather than a Wannier-Stark state. To estimate this, we considered the kinematics of impact ionization in bulk InP. For electron-initiated impact ionization, we solved the conservation of energy and the two-dimensional conservation of momentum equations under the effective mass approximation for these reactions:

$$e \rightarrow e+e+H \quad (I)$$

$$e \rightarrow e+e+h \quad (II)$$

where e is an electron, H is a heavy hole and h is a light hole, and where the initial electron has kinetic energy E. We calculated the threshold for E where the reaction is allowed. Reaction I which produces a heavy hole has a threshold energy of 1.50 eV whereas reaction II which produces a light hole has a threshold energy of 1.99 eV. The threshold energy has a minimum value of the InP bandgap energy (1.34 eV), and is higher by an amount needed to impart a final momentum to each of the final particles so energy and momentum are conserved. As the initiating electron energy increases above the 1.50 eV threshold, the rate at which it can impact ionize increases as the density of final states increases. It is unlikely that it will reach the reaction II threshold. With reaction I, the kinematics dictate that the heavy hole has an energy of 0.10 eV below the valence band edge when the impact ionization occurs near the threshold energy. This places the heavy hole in the well (0.23 eV deep) for the InP—InGaAlAs pair we use for electron-initiated impact ionization.

For hole-initiated impact ionization, we consider these reactions:

$$h \rightarrow h+e+H \quad (III)$$

$$h \rightarrow h+e+h \quad (IV)$$

$$H \rightarrow H+e+H \quad (V)$$

$$H \rightarrow H+e+h \quad (VI)$$

The threshold is 1.52 eV for reaction III and 2.06 eV for reaction IV. We expect that the light hole will generate a heavy hole. The electron will have an energy 0.03 eV above the conduction band edge when the impact ionization occurs near threshold. For the heavy hole initiated impact ionization, the threshold is 2.63 eV for reaction V and 6.07 eV for reaction VI. The electron will have an energy 0.04 eV above the conduction band edge when the impact ionization occurs near threshold. For both cases, the electron will near the bottom of the well (0.40 eV deep) for the InAlAs—InGaAsP pair we use for hole-initiated impact ionization.

The hole-initiated impact ionization structure is much better for preventing unwanted carrier injection into the continuum states of the superlattice, though the electron-initiated structure may be adequate.

This analysis points out another factor that needs to be considered in comparing the two structures. When holes are initiating the impact ionization, the threshold for generating a heavy hole is lower. The valence band in an APD will be filled with heavy holes. With a threshold of 2.63 eV for heavy-hole-initiated impact ionization compared with 1.50 eV for electron-initiated impact ionization, β for the hole-initiated structure will be about 1.8 times lower than the α for the electron-initiated structure. So to obtain the same gain with both structures operating at the same electric field, the hole-initiated structure would need a 1.8 times thicker multiplication region and a 1.8 times higher voltage.

The design calculates that a conduction band superlattice is better at suppressing electron avalanche gain than a valence band superlattice at suppressing hole avalanche gain.

Another advantage of the hole-initiated structure is that holes are injected from the light absorption layer into the superlattice multiplication region. Holes are injected from below, which allows the APD to be made with zinc diffusion for select p-doping which is a commonly used to obtain low dark current and to eliminate surface breakdown in p-i-n photodiodes and APDs.

Neither structure is clearly better. The choice probably would depend on the details of the intended application.

Applications

Various systems can employ an array of a plurality of linear mode avalanche photodiodes with a matched superlattice structure. Each linear mode avalanche photodiode is configured to sense light and output electrical current by being configured to, generate a gain equal to or greater than 1000 times amplification while generating an excess noise factor of less than 3 times a thermal noise present at or above a non-cryogenic temperature due to the gain from the amplification. The linear mode avalanche photodiode detects one or more photons in the light by using a superlattice structure that is matched to suppress impact ionization for a first carrier in the linear mode avalanche photodiode while at least one of 1) increasing impact ionization, 2) substantially maintaining impact ionization, and 3) suppressing impact ionization to a lesser degree for a second carrier. The first carrier having its impact ionization suppressed is either i) an electron or ii) a hole; and then, the second carrier is the electron or the hole. A power supply is used to power the plurality of linear mode avalanche photodiodes.

The systems can include i) a LIDAR system, ii) a night vision goggle or headset system, iii) an optical communication system, iv) a spectroscopy system, v) a Quantum key distribution system, vi) a system using high breakdown voltage transistors, vii) a low-noise microwave generation system, and viii) a bio-medical system.

The linear mode avalanche photodiode, with the matched superlattice structure is configured such that the amplification occurs in merely i) the conduction band or ii) the valence band, to generate a gain of equal to or greater than 10,000 times amplification while generating an excess noise of less than 10 percent of the thermal noise present at or above a room temperature due to the gain from the amplification. The linear mode avalanche photodiode with the matched superlattice structure with the gain of 10,000 times amplification is configured to be capable of detecting a single photon without a penalty of having a deadtime after the detection of the single photon where the linear mode avalanche photodiode cannot detect another photon until after a set period of time.

Example capabilities enabled by the linear mode APD described here include:

FIG. 8 illustrates an embodiment of a diagram 800 of a linear mode APD array with a matched superlattice structure with in-situ memory and a parallel column readout. Each pixel in array sees different x-y direction, and acquires a z-direction. The array is designed for in-situ storage of each time bin, sequentially reading-out each time bin between light pulses. The light pulses such as laser pulses may be captured in 100 time bins in each 50 μm×50 μm pixel. Each time bin has a read out circuit containing a linear mode APD with a matched superlattice structure. FIG. 9 illustrates an embodiment of a diagram 900 of an example read-out circuit schematic with linear mode APDs with a matched superlattice structure. The readouts may occur at 100's frames/second. The readout circuit with 50 μm×50 μm pixel structure can store, for example, 100 time bins.

The systems using the linear mode APD array with a matched superlattice structure may include as follows.

Single shot light detection and ranging (LIDAR)—For LIDAR, a scene is illuminated by a short burst of light from a laser and reflections of this pulse is detected. The time between the emission of the laser light and the detection of a reflection gives the distance to the reflector. The lack of a deadtime in the SRI linear mode APD allows for the continuous acquisition of the reflected light waveform with a single APD. Each APD in a linear mode APD array with proper optics can detect light arriving from different directions. Each APD in the linear mode APD array can acquire the full waveform for light reflected from objects located in a unique direction determined by the optics. Thus, a linear mode APD array can collect all reflections of a single laser shot over a field-of-view determined by the optics. The collected data represents a three-dimensional image of the scene where the arrival time gives the z-direction and each APD gives the x- and y-directions.

The waveform representing the data along the z-direction can be broken into time bins and the APD output current integrated over each time bin stored as charge in a separate capacitor in the readout circuit. We have determined that a 50 μm×50 μm pixel can have 100 storage capacitors in addition to the electronics needed to integrate the current and to read out the charge in the capacitors.

Because of the deadtime of Geiger mode APDs, two methods are used to acquire the all of the reflections. First, an array of parallel connected Geiger mode APDs to form a superpixel can be used to ameliorate the deadtime. The large size of the superpixel limits the arraying of superpixels to a linear array, so imaging in the direction orthogonal to the linear array is done either by illuminating the whole scene and rotating a narrow field-of-view APD array or by illuminating a stripe of the scene collinear with a wide field-of-view APD array and moving the stripe. This requires multiple laser shots to acquire the full three dimensional image.

The second method uses a two-dimensional array of independent Geiger mode APDs. Each APD collects reflected light from a different direction as in the linear mode APD array. The Geiger mode APDs are all gated open by biasing them above breakdown at a pre-determined delay after the laser shot and for a pre-determined duration. The output of the array gives the x-y image of the photon arrival during the time interval when the APDs are gated open. The output from a particular APD is the same whether one or many photons arrived during that interval. By varying the gate delay, the full three dimensional image can be acquired with multiple laser shots.

Advantages of acquiring the three-dimensional image in a single shot are (1) faster acquisition time and (2) lack of distortion and blurring due to motion, both within the scene and between the LIDAR system and the scene. The faster acquisition makes possible three-dimensional video. The insensitivity to motion gives sharper images and relaxes the requirement for a very stable platform for the LIDAR system.

Imaging through obscurants—The principle is the same as for a single shot LIDAR. The difference is that reflections due to obscurants, such water droplets in fog or smoke particles, occur randomly since the particles are randomly distributed and are changing quickly with time since they are undergoing Brownian motion, sedimentation or convection. Objects of interest are much more massive than obscurants so they move more slowly and cannot change their velocity quickly. So by keeping only reflections that originate from the same point or that originate from a series of points lying on a straight line over several consecutive three-dimensional images, much of the reflections from obscurants can be filtered out.

Low light level imaging—In low light level imaging, it is often desirable to increase the photocurrent from a detector enough to be above the noise floor of the electronic amplifiers. The linear mode APD can be operated with modest gain, not enough to detect single photons, to do this. Alternative methods to do this are to increase the light collection aperture and to increase the integration time. Larger apertures result in larger optical components and bulkier, more expensive systems. Increased integration times require that the imager be on a stable mechanical support such as a tripod. Integration cannot be used for a dynamic scene changing faster than the integration time.

An important case of low light level imaging is night vision. Without sunlight or an illuminator, the only illumination sources are moonlight, airglow and starlight, where airglow is emission in the visible but mostly in the near and short wave infrared originating in the ionosphere from the recombination of ions created by sunlight earlier that day and by cosmic rays. Imaging without gain requires the light of a full moon to obtain a usable image at standard video rates with the light collection optics of a common handheld camera. Night vision goggles and image intensifiers, which have gains of $10^4$ to more than $10^6$, can be used to image in overcast moonless nights where the illumination source is airglow and starlight scattered and attenuated by the clouds. The gain provided by a linear mode APD without excess noise is similar to that of night vision goggles and image intensifiers, so it is expected to image in overcast moonless nights. A significant difference is the much smaller size of the APD. Another significant difference is that the output of night vision googles is an image on a phosphorescent screen which cannot be read out for archiving or for image processing without a separate camera, whereas the output of an imager made from an array of linear mode APDs will be digitized.

Spectroscopy and detection of chemical and biological agents—Spectroscopy is operationally equivalent to low light level imaging where the scene is the output of a dispersive element such as a diffraction grating. The gain of an array of linear mode APDs can be adjusted to give a modest gain to enough gain for signal photon detection, giving a large dynamic range. Moreover, the waveform seen by the individual APDs in an array can be stored as with the single shot LIDAR application. Analogous to single shot LIDAR, this ability will enable the acquisition of the entire time-resolved spectrum triggered by a single event.

The ability to do spectroscopy at the single photon detection level can used to detect molecules at very low levels of concentrations. Time-resolved spectroscopy adds the ability to monitor molecular kinetics that can be provide information about the molecule's environment. The ability to detect trace amounts of specific chemical and biological molecules is beneficial to the areas of security where these molecules can be illicit drugs, chemical or biological warfare agents or explosives, quality control where these molecules can be an impurity or unwanted byproduct of a manufacturing process, and biomedical research where these molecules can be a new drug being developed.

Quantum key distribution—This requires the detection of single photons with high quantum efficiency, preferably near room temperature. The room temperature, single photon detection technologies currently available are photomultiplier tubes and Geiger mode APDs. Photomultiplier tubes have very low quantum efficiencies, especially at the wavelengths typically used for telecommunications. Geiger mode APDs effectively have low quantum efficiency because of their deadtime. A linear mode APD without excess noise would be able to detect single photons with high quantum efficiency.

Optical communications—The dominant noise in most, if not all, optical communications systems is thermal noise in the receiver electronics, so the basic challenge in optical communications is to have an optical signal going into a receiver with sufficient power to exceed receiver noise equivalent input. Commonly used methods to ensure this are to increase the power produced by the laser, to reduce the length of the optical link to reduce losses and to put a repeater in the link. A linear mode APD without excess noise at the receiver will increase the incoming optical signal in a less costly and less disruptive manner: lasers with high power output are expensive and the increased laser power can introduce new difficulties such as nonlinear effects in the optical fiber or the atmospheric transmission medium, link lengths are often fixed by the application or by geography and cannot be reduced, and repeaters are very expensive, especially in regions like the ocean floor where electrical power is not easily accessible.

High breakdown voltage transistors—The output power of a transistor is limited by its breakdown voltage. As discussed above, impact ionization initiated by a single carrier ($\alpha=0$ or $\beta=0$) results in carrier densities that are exponentially growing but that do not become arbitrarily large. Furthermore, the exponential growth of carrier density will be suppressed for a superlattice with $\alpha=\beta=0$ achieved by designing localized Wannier-Stark states in both the conduction and valence bands. Carrier transport through the superlattice is by hopping. The hopping time can be reduced to give carriers an effective velocity comparable to the saturation velocity by increasing the wavefunction overlap between adjacent Wannier-Stark states.

The highest electric field in a bipolar transistor occurs in the collector near the collector-base junction. Since the current flow in a bipolar transistor is typically normal to the surface of the semiconductor, it would be straightforward to replace the collector of a bipolar transistor with a $\alpha=\beta=0$ superlattice where the superlattice normal coincides with the current flow.

Low-noise microwave generation—Impact ionization is a critical part of the operation of a class of microwave diodes which includes the Read diode and the impact ionization avalanche transit time (IMPATT) diode. With impact ionization providing gain and the carrier transit time providing an appropriate phase shift, they are used a negative differential resistance element to generate microwaves. These generators are low cost and can produce high power, but the high phase noise in their output have limited their application. The source of the noise is the excess noise in the impact ionization mechanism. With the superlattice describe here as the impact ionization layer of the diode, excess noise will be suppressed and microwave generators built around these diodes can be low cost, high power and low noise.

References in the specification to "an embodiment," "an example", etc., indicate that the embodiment or example described may include a particular feature, structure, or characteristic, but every embodiment may not necessarily include the particular feature, structure, or characteristic. Such phrases can be not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

The invention claimed is:

1. An apparatus, comprising:
a photodiode constructed with
1) a lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current,
2) a third semiconductor alloy forming an absorber region,
3) a semiconductor substrate comprising an alloy, where the multiplication region and absorber region are lattice matched to the semiconductor substrate, where the multiplication region and the absorber region alternatively stack upon each other starting from the semiconductor substrate, and
where alloys in the multiplication region, the absorber region, and the semiconductor substrate are matched to provide the photodiode to have a minimum wavelength cutoff between 1.0 μm and 4.9 μm as well as a noise resulting from a dark current at a level such that an electromagnetic radiation signal with a desired minimum wavelength cutoff can be accurately sensed by the photodiode.

2. The apparatus of claim 1, where the first semiconductor alloy making up the multiplication region is InGaAsSb with the superlattice being set in a conduction band so that electrons impact ionize, the third semiconductor alloy making up the absorber region is InGaAsSb, and the semiconductor substrate is made up of GaSb.

3. The apparatus of claim 2, where the first semiconductor alloy making up the multiplication region is made up of an alloy with a composition of $In_{0.09}Ga_{0.91}As_{0.08}Sb_{0.92}$, and where the third semiconductor alloy making up the absorber region is a similar alloy of InGaAsSb but does not have a same composition as the multiplication region.

4. The apparatus of claim 2, where the photodiode including its i) substrate and ii) semiconductor alloys was manufactured via a complementary metal-oxide-semiconductor (CMOS) process using substantially a same manufacturing step to grow both an InGaAsSb layer of the multiplication region and an InGaAsSb layer of the absorber region.

5. The apparatus of claim 2, where the second semiconductor alloy is AlGaAsSb, and where the first semiconductor alloy is paired with the second semiconductor alloy of AlGaAsSb to make up the multiplication region.

6. The apparatus of claim 5, where the second semiconductor alloy for the multiplication region is made up with a composition of $Al_{0.14}Ga_{0.86}As_{0.01}Sb_{0.99}$.

7. The apparatus of claim 1, where the photodiode is a linear mode avalanche photodiode with the minimum wavelength cutoff at a maximum value of 3.3 μm.

8. The apparatus of claim 1, where the lattice matched pair of semiconductor alloys making up the multiplication region are $In_{0.17}Ga_{0.83}As_{0.16}Sb_{0.84}$ and $Al_{0.26}Ga_{0.74}As_{0.02}Sb_{0.98}$, the third semiconductor making up the absorber region is InGaAsSb, and both regions are lattice matched to a GaSb substrate.

9. The apparatus of claim 1, where the semiconductor alloy making up the absorber region is an InGaAs—GaAsSb superlattice that is lattice matched to an InP substrate.

10. The apparatus of claim 9, where the lattice matched pair of semiconductor alloys making up the multiplication region is an InGaAsP—InAlAs superlattice.

11. A method, comprising:
creating a photodiode constructed with
1) a lattice matched pair of a first semiconductor alloy and a second semiconductor alloy in a superlattice multiplication region that allows only one electrical-current carrier type selected from i) an electron or ii) a hole to accumulate enough kinetic energy to impact ionize when the photodiode is electrically biased to conduct electrical current,
2) a third semiconductor alloy forming an absorber region,
3) a semiconductor substrate comprising an alloy, where the multiplication region and absorber region are lattice matched to the semiconductor substrate, where the multiplication region and the absorber region alternatively stack upon each other starting from the semiconductor substrate, and
where alloys in the multiplication region, the absorber region, and a semiconductor substrate are matched to provide the photodiode to have a minimum wavelength cutoff between 1.0 μm and 4.9 μm as well as a noise resulting from a dark current at a level such that an electromagnetic radiation signal with a desired minimum wavelength cutoff can be accurately sensed by the photodiode.

12. The method of claim 11, where the first semiconductor alloy making up the multiplication region is InGaAsSb with the superlattice being set in a conduction band so that electrons impact ionize, the third semiconductor alloy making up the absorber region is InGaAsSb, and the semiconductor substrate is made up of GaSb.

13. The method of claim 12, where the first semiconductor alloy making up the multiplication region is made up of an alloy with a composition of $In_{0.09}Ga_{0.91}As_{0.08}Sb_{0.92}$, and where the third semiconductor alloy making up the absorber region is a similar alloy of InGaAsSb but does not have a same composition as the multiplication region.

14. The method of claim 12, where the photodiode including its i) substrate and ii) semiconductor alloys can be manufactured via a complementary metal-oxide-semiconductor (CMOS) process using substantially a same manufacturing step to grow both an InGaAsSb layer of the multiplication region and an InGaAsSb layer of the absorber region.

15. The method of claim 12, where the second semiconductor alloy is AlGaAsSb, and where the first semiconductor alloy is paired with the second semiconductor alloy of AlGaAsSb to make up the multiplication region.

16. The method of claim 15, where the second semiconductor alloy for the multiplication region is made up with a composition of $Al_{0.14}Ga_{0.86}As_{0.01}Sb_{0.99}$.

17. The method of claim 11, where the photodiode is a linear mode avalanche photodiode with the minimum wavelength cutoff at a maximum value of 3.3 μm.

18. The method of claim 11, where the lattice matched pair of semiconductor alloys making up the multiplication region are $In_{0.17}Ga_{0.83}As_{0.16}Sb_{0.84}$ and $Al_{0.26}Ga_{0.74}As_{0.02}Sb_{0.98}$, the third semiconductor making up the absorber region is InGaAsSb, and both regions are lattice matched to a GaSb substrate.

19. The method of claim 11, where the semiconductor alloy making up the absorber region is an InGaAs—GaAsSb superlattice that is lattice matched to an InP substrate.

20. The method of claim 19, where the lattice matched pair of semiconductor alloys making up the multiplication region is an InGaAsP—InAlAs superlattice.

* * * * *